United States Patent
Kondo et al.

(10) Patent No.: US 6,794,275 B2
(45) Date of Patent: Sep. 21, 2004

(54) PROCESS FOR FORMING A SILICON-BASED FILM ON A SUBSTRATE USING A TEMPERATURE GRADIENT ACROSS THE SUBSTRATE AXIS

(75) Inventors: Takaharu Kondo, Kyoto (JP); Shotaro Okabe, Nara (JP); Masafumi Sano, Kyoto (JP); Akira Sakai, Kyoto (JP); Yuzo Koda, Kyoto (JP); Ryo Hayashi, Nara (JP); Shuichiro Sugiyama, Kyoto (JP); Koichiro Moriyama, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/113,675

(22) Filed: Apr. 2, 2002

(65) Prior Publication Data

US 2003/0104664 A1 Jun. 5, 2003

(30) Foreign Application Priority Data

Apr. 3, 2001 (JP) .................................. 2001-105021
Apr. 3, 2001 (JP) .................................. 2001-105023
Mar. 29, 2002 (JP) .................................. 2002-095458

(51) Int. Cl.$^7$ ............................................ H01L 21/365
(52) U.S. Cl. .................. 438/485; 438/486; 438/488
(58) Field of Search ............................ 438/485, 486, 438/488, 647, 657, 680, 684

(56) References Cited

U.S. PATENT DOCUMENTS

| | | | | |
|---|---|---|---|---|
| 4,131,659 A | * | 12/1978 | Authier et al. | 438/62 |
| 4,489,103 A | * | 12/1984 | Goodman et al. | 438/764 |
| 4,933,203 A | | 6/1990 | Curtins | 427/38 |
| 5,882,989 A | * | 3/1999 | Falster | 438/473 |
| 5,990,005 A | * | 11/1999 | Hirose et al. | 438/660 |
| 6,140,204 A | * | 10/2000 | Watanabe | 438/398 |
| 6,337,224 B1 | | 1/2002 | Okamoto et al. | 438/69 |

FOREIGN PATENT DOCUMENTS

| | | |
|---|---|---|
| JP | 7-105354 B2 | 11/1995 |
| JP | 10-321525 | 12/1998 |
| JP | 11-330520 | 11/1999 |

* cited by examiner

Primary Examiner—Erik J. Kielin
Assistant Examiner—Stephen W. Smoot
(74) Attorney, Agent, or Firm—Fitzpatrick, Cella, Harper & Scinto

(57) ABSTRACT

In a process for forming a silicon-based film on a substrate according to the present invention, the substrate has a temperature gradient in the thickness direction thereof in the formation of the silicon-based film and the temperature gradient is made such that a deposition surface of the substrate has a higher temperature than a backside or the direction of the temperature gradient is reversed. With this configuration, the present invention provides a silicon-based thin film having good properties at a high deposition rate and provides a semiconductor device including it. The present invention also provides a semiconductor device including the silicon-based thin films that has good adhesion and weather-resisting properties and that can be manufactured in a short tact time.

37 Claims, 8 Drawing Sheets

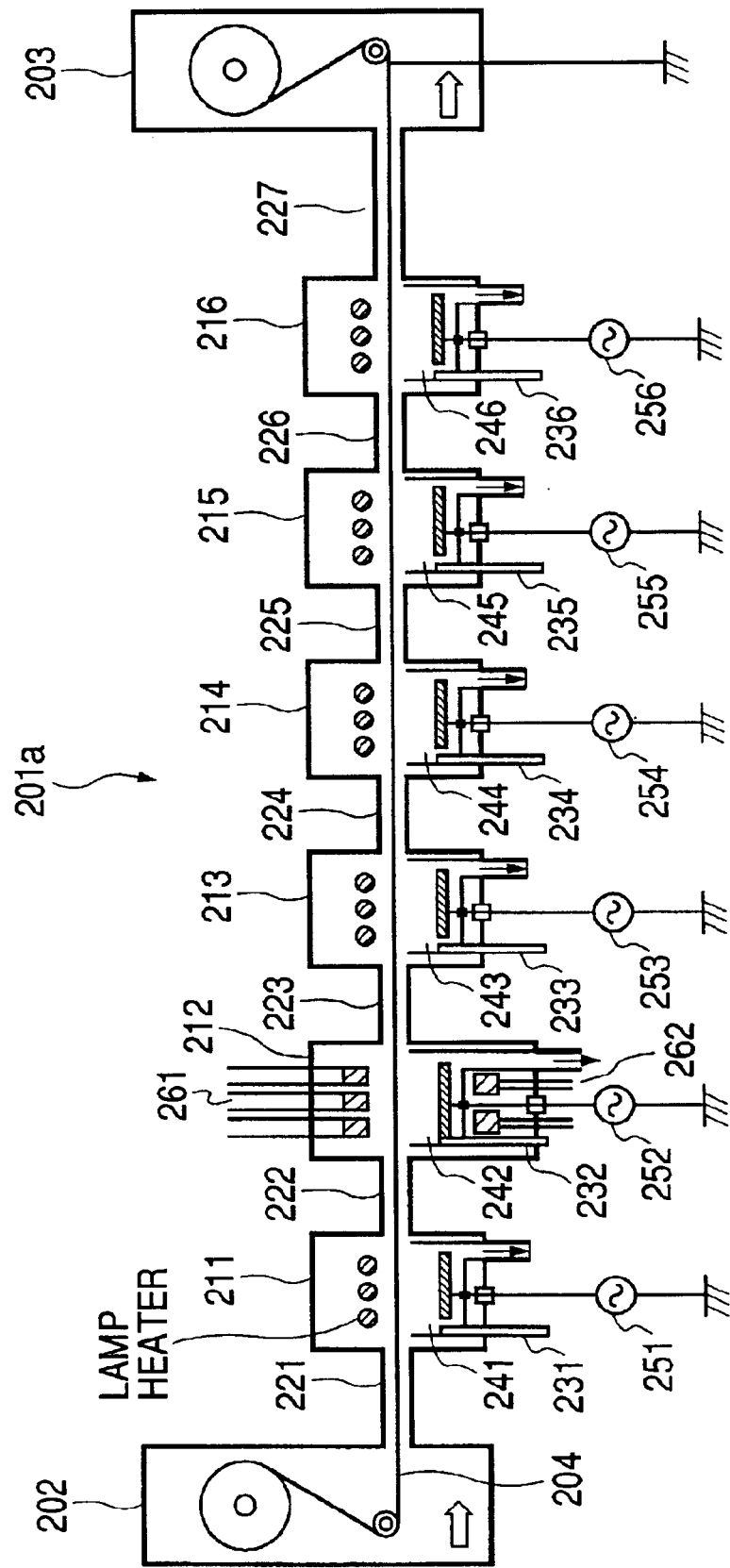

PROCESS FOR FORMING A SILICON-BASED FILM ON A SUBSTRATE USING A TEMPERATURE GRADIENT ACROSS THE SUBSTRATE AXIS

BACKGROUND OF THE INVENTION

1. Field of the Invention

The present invention relates to a silicon-based thin film, a process for forming a silicon-based thin film, and a semiconductor device having a semiconductor junction which is formed of the silicon-based thin film.

2. Related Background Art

As a process for forming silicon-based thin films, a high frequency plasma technique is one of useful ways of mass-production of the silicon-based thin films from the viewpoint that enlargement of the area and formation at a low temperature are possible, and that a process through-put can be improved.

With solar cells considered as an example of a semiconductor device having a semiconductor junction which is formed of a silicon-based thin film, solar cells using a silicon-based thin film are advantageous in that the energy can be generated using an inexhaustible source and a clean power generation process over conventional energies obtained by fossil fuels. However, it is necessary to reduce a unit price per generated electric power in order to encourage broad use of them. To this end, there has been an important technological challenge to establish a method to improve a deposition rate and efficiency of photoelectric conversion in a high frequency plasma CVD technique. For thin-film transistors which are used to for example drive a matrix of a liquid crystal display device, thin-film transistors having a higher mobility are required to facilitate reduction in size of the device and provide fine images because such transistors ensure a necessary current value for circuit operation and allow fine pixel pitches even when a gate width of the thin-film transistor becomes small.

In photovoltaic devices having a pin junction, it is effective that an i-type semiconductor layer includes a crystalline phase because photodegradation due to the Staebler-Wronski effect specific to amorphous semiconductors can be restricted when the i-type semiconductor layer including the crystalline phase is used as a i-type semiconductor layer which substantially serves as a photo-absorption layer. Crystalline thin-film transistors have an at least double-figure higher mobility than amorphous thin-film transistors. Therefore, it can be expected that TFT properties be improved significantly.

Against the backdrop of the above, various approaches and efforts have been taken in recent years about the techniques that are associated with fast deposition of a silicon-based thin film and associated with formation of silicon-based thin films including a crystalline phase.

As to the high frequency plasma CVD technique performed at a higher deposition rate, Japanese Patent Publication No. 7-105354 discloses that the inventor focused on a relation of a frequency f and a distance d, between a substrate and electrodes, in a range of f between 25 and 150 MHz, wherein f represents a high frequency (MHz) and d represents a distance (cm) between the substrate and the electrodes. It is also disclosed that such methods are preferable in which the ratio f/d is included between 30 and 100 MHz/cm, in particular, with the distance d included between 1 and 3 cm or a pressure included between 0.1 and 0.5 mbar.

In addition, as to a process for manufacturing crystalline silicon-based thin film layers, Japanese Patent Application Laid-Open No. 11-330520 discloses that silicon-based thin film layers can be deposited at a fast rate when they contain a silane-based gas and a hydrogen gas and are produced under conditions where a pressure in a reaction chamber is set to at least 5 Torr and where a distance between a substrate and electrodes is not larger than 1 cm. It is also disclosed that a photoelectric converter using this exhibits high conversion efficiencies.

When the silicon-based thin film is formed on a substrate, a temperature on a deposition surface affects surface diffusion of various active species that contribute to deposition phenomena, a formation density of unbound species formed on the deposition surface, and delamination reaction from the silicon-based thin film. Therefore, the temperature is considered as an important parameter to control the deposition rate and the film properties.

Conventionally, as a method for controlling the temperature on the deposition surface, the substrate is subjected to sufficient pre-heating before formation of the silicon-based thin film. Alternatively, a heat source having a large thermal capacity is used. Thus, the temperature is kept constant on the substrate at a predetermined temperature in the direction of the film thickness. Then, the silicon-based thin film is formed while maintaining the states.

In a method for forming silicon-based thin films on a substrate using a high frequency plasma CVD, it has come to be found that increasing film deposition rate can be done under the conditions in which a high frequency power to be introduced is increased, a distance between a substrate and a high frequency input unit is shortened, and a high frequency power per a plasma discharge space is increased.

However, the above-mentioned way to control the temperature of the substrate has drawbacks in that increasing a film thickness may gradually lower quality of silicon-based thin films, vary quality of an initial area for deposition, or deform a substrate after deposition due to a stress strain.

In order to provide a silicon-based thin film of good performance at a lower cost, the present invention is directed to provide a silicon-based thin film having good properties at a higher deposition rate and provide a semiconductor device including it. Furthermore, the present invention is directed to provide a semiconductor device including the silicon-based thin films that has good adhesion and weather-resisting properties and that can be manufactured in a short tact time.

SUMMARY OF THE INVENTION

The present invention provides a process for forming a silicon-based film on a substrate, comprising providing a temperature gradient in the thickness direction of the substrate in the formation of the silicon-based film wherein the temperature gradient is made such that a deposition surface of the substrate has a higher temperature than a backside.

The present invention also provides a silicon-based film formed on a substrate, the substrate having a temperature gradient in the thickness direction thereof in the formation of the silicon-based film, the temperature gradient being formed using a method that achieves a higher temperature on a side of a deposition surface of the substrate than that on a backside.

Furthermore, the present invention provides a semiconductor device having a semiconductor junction on a substrate, the semiconductor junction comprising silicon-based films, wherein at least one of the silicon-based films in the semiconductor device has a temperature gradient in the thickness direction of the substrate, the temperature gradient being formed using a method that achieves a higher temperature on a side of a deposition surface of the substrate than that on a backside.

It is preferable that the temperature gradient C be defined by C=ΔT/d wherein d represents a thickness of the substrate and ΔT represents a temperature difference between the deposition surface and the backside of the substrate, and that a value of C be in a range between 500° C./m and 100,000° C./m, both inclusive. It is also preferable that heat sources be provided on the deposition surface side of the substrate and the backside thereof, the heat sources being used to apply heat to the substrate in the formation of the silicon-based film.

In addition, the present invention provides a process for forming a silicon-based film on a substrate wherein the substrate has a temperature gradient in the thickness direction thereof in the formation of the silicon-based film, and wherein the direction of the temperature gradient is reversed during the formation of the silicon-based film.

The present invention also provides a silicon-based film formed on a substrate, the substrate having a temperature gradient in the thickness direction thereof in the formation of the silicon-based film, the temperature gradient being formed using a method wherein the direction of the temperature gradient is reversed during the formation of the silicon-based film.

The present invention also provides a semiconductor device having a semiconductor junction on a substrate, the semiconductor junction comprising silicon-based films, wherein at least one of the silicon-based films has a temperature gradient in the thickness direction of the substrate, the temperature gradient being formed using a method wherein the direction of the temperature gradient is reversed during the formation of the silicon-based film.

It is preferable that the temperature gradient C be defined by C=ΔT/d wherein d represents a thickness of the substrate and ΔT represents a temperature difference between the deposition surface and the backside of the substrate, and that a value of C be varied within a range not larger than 100,000° C./m. It is also preferable that in the process where the direction of the temperature gradient is reversed during the formation of the silicon-based film, the temperature gradient C include a range of at least 500° C./m in a process where the deposition surface of the substrate has a higher temperature than the backside and in a process where the backside has a higher temperature than the deposition surface.

In the above description, it is preferable that a cooling mechanism be provided on the deposition surface side of the substrate and/or the backside thereof in the formation of the silicon-based film. It is preferable that the temperature of the backside of the substrate be reduced in the course of forming the silicon-based film. It is also preferable that the silicon-based film be a silicon-based film including a crystalline phase. It is also preferable that the silicon-based film including the crystalline phase have a region of which ratio of the diffraction intensity of (220) planes in the crystalline phase is 80% or higher with respect to the total diffraction intensity obtained using an x-ray or an electron beam. It is preferable that the silicon-based film be formed on the substrate loaded in the vacuum vessel, using a high frequency plasma CVD technique that involves introducing a source gas containing hydrogen and at least one of a hydrogenated silicon gas and a fluorinated silicon gas into a vacuum vessel and introducing high frequency waves into a high frequency input unit in the vacuum vessel. It is preferable that the high frequency waves have a frequency between 10 MHz and 10 GHz, both inclusive. In this event, it is more preferably that the high frequency waves have a frequency between 20 MHz and 300 MHz, both inclusive. It is preferable that a distance between the high frequency input unit and the substrate be equal to or larger than 3 mm but not larger than 30 mm. It is preferable that a pressure in forming the silicon-based film be equal to or higher than 100 Pa (0.75 Torr) but not higher than 5,000 Pa (37.5 Torr). It is preferable that a residence time of the source gas in forming the silicon-based film be equal to or longer than 0.01 seconds but not longer than 10 seconds. In this event, it is more preferable that the residence time of the source gas in forming the silicon-based film be equal to or longer than 0.1 seconds but not longer than 3 seconds. It is preferable that a power density in forming the silicon-based film be equal to or higher than 0.01 W/cm$^3$ but not higher than 2 W/cm$^3$. In this event, it is more preferable that the power density in forming the silicon-based film be equal to or higher than 0.1 W/cm$^3$ but not higher than 1 W/cm$^3$. It is preferable that the silicon-based film contains at least one of oxygen atoms, carbon atoms and nitrogen atoms, and that the total amount thereof be equal to or larger than $1.5 \times 10^{18}$ atoms/cm$^3$ but not larger than $5.0 \times 10^{19}$ atoms/cm$^3$. It is preferable that the silicon-based film contains fluorine atoms in an amount equal to or larger than $1.0 \times 10^{19}$ atoms/cm$^3$ but not larger than $2.5 \times 10^{20}$ atoms/cm$^3$. It is preferable that the semiconductor device having the semiconductor junction include at least one pair of pin-type semiconductor junctions, the pin-type semiconductor junction comprising of a first electrically conductive semiconductor layer, an i-type semiconductor layer, a second electrically conductive semiconductor layer, which are laminated on top of each other.

BRIEF DESCRIPTION OF THE DRAWINGS

FIGS. 2A and 2B are schematic cross-sectional views showing an example of a film deposition system which is used to produce a semiconductor device and a photovoltaic device according to the present invention.

DESCRIPTION OF THE PREFERRED EMBODIMENTS

Figure 1:
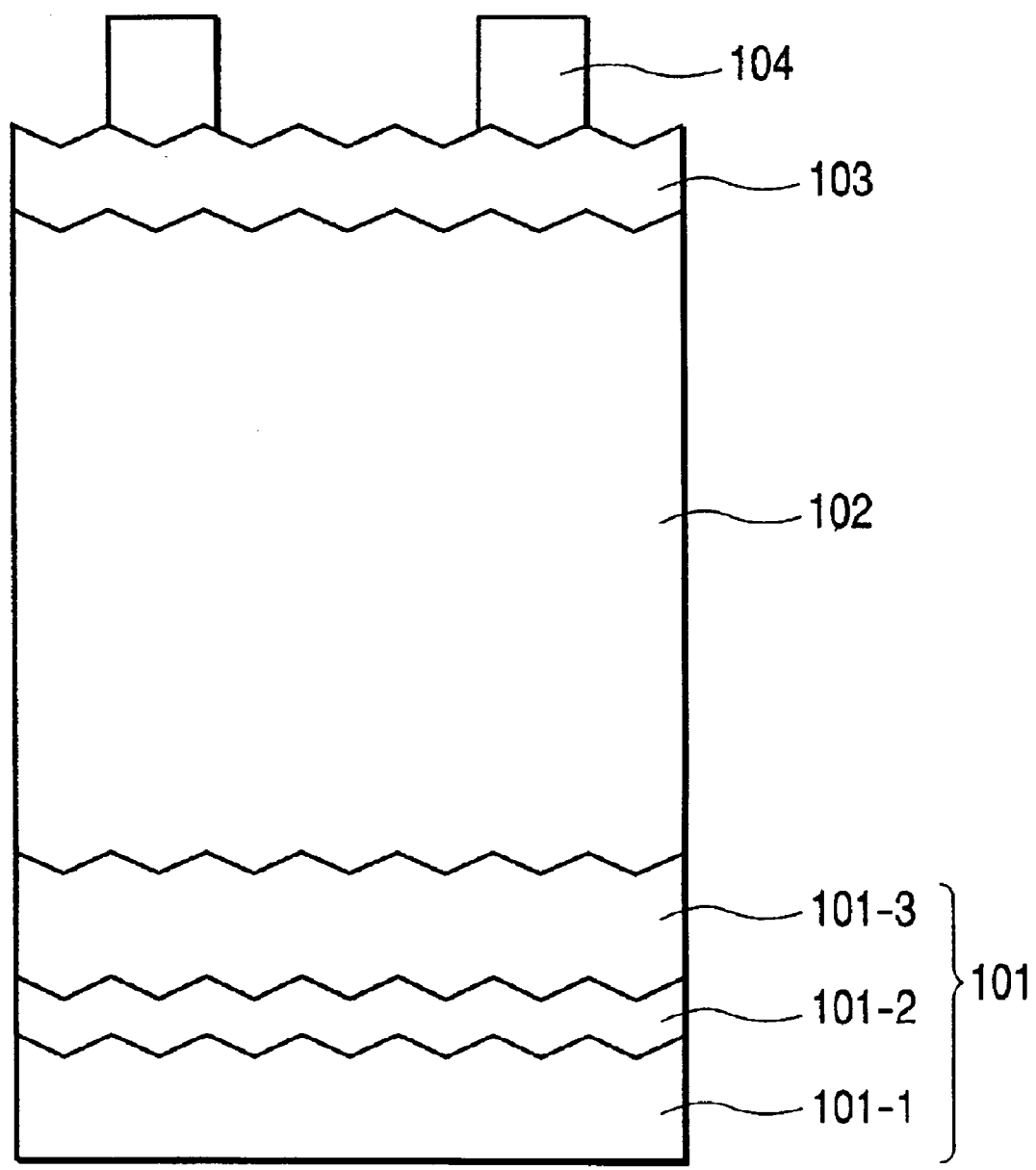
FIG. 1 is a schematic cross-sectional view showing an example of a photovoltaic device including a semiconductor device according to the present invention.

As a result of extensive research in order to solve the above-mentioned problems, the present inventors found that a silicon-based thin film with low defect density can be formed on a substrate using high rate deposition when the substrate has a temperature gradient in the thickness direction thereof and, more particularly, when the direction of the temperature gradient is reversed during the formation of the silicon-based thin film; that good electrical properties can be achieved in a semiconductor device in which at least one constituting silicon-based thin film of the semiconductor device is formed according to the above-mentioned procedure; and that it is possible to produce, at low costs, a semiconductor device having excellent adhesion and weather-resisting properties.

The above-mentioned configuration has the following operations.

In a method for introducing a source gas into a vacuum vessel and forming a silicon-based thin film on a substrate loaded onto the vacuum vessel using a high frequency plasma CVD technique, the plasma density per a unit volume of a discharge space increases as the distance becomes small between the substrate and a high frequency input unit. This allows high-density formation of reactive species that contribute to deposition of the films. Thus, it is expected that the deposition rate can be increased.

In order to increase the deposition rate to form a film of high quality containing fewer unbound species of silicon atoms, it is necessary to cause more active species associated with the deposition reaction to reach a deposition surface and to enhance surface diffusion in a deposition surface region, thereby to guide effectively the silicon atoms to a site where energetically stable binding can be achieved on the deposition surface.

In this case, the surface diffusion should be enhanced further depending on the deposition rate in order to maintain the quality of a film medium. However, an increase in deposition rate has a certain limitation when the temperature of the substrate is controlled so that the temperature in the thickness direction is kept constant at a predetermined temperature. In particular, the quality of the film medium decreases noticeably with a silicon-based thin film of a larger thickness. Details of the phenomenon are unknown. However, it is expected that the enhancement of the surface diffusion causes the atoms in the region inside the silicon-based thin film to wiggle around at higher speeds with thermal vibration. The position of the silicon atoms already determined may be made unstable, which results in a change in position of the silicon atoms and, in turn, misalignment of the silicon atoms. Furthermore, dangling bonds appear in the film when hydrogen atoms are released upon breaking of Si—H bonds on amorphous regions and at or around grain boundaries when a crystalline phase is used. This may further enhance the misalignment of the silicon atoms. In such a case, more hydrogen atoms are released from the films within regions initially subjected to deposition. The dangling bond density becomes larger in these regions. Accordingly, it is expected that the regions are greatly affected by the degradation of the quality of the film medium. The misalignment of the atoms can be expected to become larger with the increase of the thickness of the film, because a film of a larger thickness suffers from greater influence. Such influence becomes more noticeable under conditions where impact of the plasma active species increases.

When there exists a temperature gradient within the substrate in the thickness direction thereof during the formation of the silicon-based thin film and when the temperature gradient shows that the deposition surface of the substrate has a higher temperature than the backside, heat conduction occurs through the substrate in the direction of the film thickness. In such a case, it can be considered that a temperature gradient also exists across the silicon-based thin film on the substrate in the thickness direction thereof. Thus, it is possible to inhibit the thermal vibration in the region inside the silicon-based thin film and to stabilize the position of the silicon atoms and the Si—H bond, while enhancing the surface diffusion in the deposition surface region. From the above, it can be expected that a silicon-based thin film of high quality can be formed at a higher deposition rate and a larger film thickness.

On the other hand, when there exists a temperature gradient within the substrate in the thickness direction thereof during the formation of the silicon-based thin film and when the temperature gradient is reversed during the formation of the silicon-based thin film, it is possible to inhibit the thermal vibration in the region inside the silicon-based thin film and to stabilize the position of the silicon atoms and the Si—H bond, while enhancing the surface diffusion in the deposition surface region because the heat conduction occurs through the substrate in the direction of the film thickness and the direction is reversed. In addition, the hydrogen atoms in the film diffuse more rapidly in various directions. This may promote relaxation of a network structure by the Si atoms, reducing the dangling bond density and improving the film quality. In particular, it is suggested that the above phenomenon advantageously lowers the dangling bond density within the regions initially subjected to deposition. Taking the above into consideration, it can be expected that a silicon-based thin film of high quality can be formed at a higher deposition rate and a larger film thickness.

Moreover, an internal stress of the deposited silicon-based thin film is alleviated because the direction of the temperature gradient is reversed during the formation of the silicon-based thin film. This prevents the substrate from being warped. Thus, adhesion is improved between the substrate and the silicon-based thin film.

It is suggested that the temperature on the deposition surface would be more uniform by generating a temperature gradient to diffuse heat than by controlling the temperature in the film thickness direction of the substrate if the deposition surface region is subjected to high impact under conditions where impact of the plasma active species increases. This would improve the uniformity of the silicon-based thin film.

In order to effectively provide the above-mentioned phenomenon, it is preferable that a value of the temperature gradient be 500° C./m or larger, with the value being defined by $C=\Delta T/d$ wherein d represents a thickness of the substrate and $\Delta T$ represents a temperature difference between the deposition surface of the substrate and the backside thereof. Too large of a temperature gradient may result in deformation of the substrate after being cooled, which may be a cause of film delamination. The value of the temperature gradient is preferably within a range not larger than 100,000° C./m. It should be noted that the value may be smaller than 500° C./m in the course of reversing the direction of the heat conduction.

As a method for controlling the temperature during the formation of the silicon-based thin film, it is preferable that an operation state of a heat source and/or a cooling mechanism be checked and a relation in temperature be determined between the deposition surface and the backside, before measurement of the temperature on the backside of the substrate The measurement is preferably used to control the heat source and/or the cooling mechanism. It is particularly preferable when the temperature is difficult to be measured on the side of the deposition surface of the substrate in such a configuration that the high frequency input unit is placed closer to the substrate.

The above-mentioned misalignment of the atoms tends to be caused with a larger film thickness. Thus, it is preferred to reduce the temperature of the substrate on the backside thereof during the formation of the silicon-based thin film because the lower temperature inhibits the misalignment of the atoms to a larger degree.

The silicon-based thin film of the present invention may be formed of an amorphous layer, a crystalline phase, or a combination of the amorphous layer and the crystalline phase. With a combined structure of the amorphous layer and the crystalline phase, the crystalline phase may be dispersed in the amorphous layer or the crystalline phase may be aggregated. Alternatively, it may have such a structure that regions having a diamond-structured orientation are dispersed within an amorphous phase.

Crystalline silicon has a lower defect density in the Si—Si bond than amorphous silicon does. The carrier mobility of crystalline silicon is much higher than that of amorphous silicon that is thermodynamically unstable. In addition, crystalline silicon has a long recombination lifetime and is stable in properties for a long period of time. The properties thereof are not prone to be changed under environments subject to high temperatures and high humidity. Accordingly, there is a possibility that a stabler semiconductor device with better properties can be produced by means of using a silicon-based thin film containing a crystalline phase for a photovoltaic device or a thin-film transistor (TFT) in a semiconductor device that comprises a semiconductor junction formed of silicon-based thin films.

On the other hand, to use the silicon-based thin film containing the crystalline phase for an i-type semiconductor layer may result in the following drawbacks: the grain boundary affects both major carriers and minor carriers, deteriorating the properties. An effective measure to restrict the influence of the grain boundary is to increase a grain diameter in the i-type semiconductor layer to reduce the grain boundary density.

A preferable approach to increase the grain diameter is to restrict generation of crystal nuclei to improve the orientation of the crystal. The grains may have a random orientation in the formation of the film. In such a case, the grains collide with each other in the course of their growth. A relative size thereof becomes smaller accordingly. Alternatively, an internal stress may occur. Such random collision between the grains can be reduced by means of lining up the grains in a particular orientation and controlling the formation of the crystal nuclei to coordinate the direction of the growth. This would increase the grain diameter and restrict the internal stress. If the internal stress is generated within the silicon-based thin film, some problems occur. For example, a band profile may be deformed. Some regions of a carrier generation layer undergo reduction of electric fields when they are exposed to light beams. In TFTs, a leak current increases in a switching-off state.

In the crystalline silicon that has a diamond structure, the (220) planes have the highest in-plane atomic density. The silicon atoms in the topmost surface of growth share three of their four electrons with their neighbors. Accordingly, by using the plane as a plane where the grains are grown, it would be possible to form a silicon-based thin film having good adhesion and weather-resisting properties within and between microcrystals, which is preferable. When an inverted-stagger type TFT is used as an active matrix liquid crystal display device, the silicon-based thin film may be configured so that it contains microcrystals in which a region in contact with an Ohmic contact layer of an active layer is predominantly oriented in the (220) plane. With this configuration, the Ohmic contact layer can be removed completely without using any etching stopper material such as a nitride film and without etching the active layer while dry-etching the Ohmic contact layer. This is due to the (220) plane having an excellent etching-resisting property. In non-oriented crystalline silicon, a ratio of the diffraction intensity of the (220) plane is about 23% to the total diffraction intensity obtained for the eleven reflections from a small angle side. Any structures having a higher ratio than 23% for the diffraction intensity of the (220) plane exhibit the orientation in this plane direction. In particular, the above-mentioned effect is enhanced and is thus preferable in a structure having a region of which ratio of the diffraction intensity of the (220) plane is 80% or higher.

The above-mentioned high frequency plasma CVD technique is an excellent process for producing the silicon-based thin film of the present invention. The method for producing the silicon-based thin films by using the high frequency plasma CVD technique requires a shorter process time and a lower process temperature as compared with a solid phase reaction, so that this method is advantageous for cost reduction. In particular, in a photovoltaic device having a pin junction, application of it to an i-type semiconductor layer having a large film thickness produces the above-mentioned effect significantly. It is particularly preferable that the i-type semiconductor layer be formed at a deposition rate of 2.0 nm/s or faster. More specifically, a CVD technique using high frequency waves of 10 MHz to 10 GHz is particularly preferable.

In the method for introducing the source gas into the vacuum vessel and forming the silicon-based thin film on the substrate loaded onto the vacuum vessel using the high frequency plasma CVD technique, the plasma density per a unit volume of the discharge space increases as the distance becomes small between the substrate and the high frequency input unit. This allows high-density formation of reactive species that contribute to deposition of the films. Thus, it is expected that the deposition rate can be increased.

On the other hand, an electron density in plasma increases as the distance becomes small between the substrate and the high frequency input unit, which may increase the amount of ions generated. The ions are accelerated by the electrostatic attraction in sheath regions within the discharge space. Consequently, the atomic arrangement in bulk may be deformed as the ion collision or voids may be produced in the film. Therefore, the ions may be an inhibitory factor against formation of the silicon-based thin film of high quality. With an increase in pressure in the deposition space, ions will have chances to collide with other ions or active species. This reduces collision force of the ions. It would also be possible to reduce the volume of the ions, decreasing a relative amount of the ion collision. On the other hand, the plasma is concentrated more and more around the high frequency input unit with an increasing pressure. Under such a circumstance, it would be difficult to enhance the uniformity in forming the silicon-based thin film over a large area.

With a hydrogenated silicon compound $SiH_4$ used as the source gas, a high frequency power to be absorbed per a unit volume of a discharge space increases when the distance becomes small between the substrate and the high frequency input unit. This promotes degradation of $SiH_4$, contributing to a higher deposition rate. The silicon-based thin film is expected to be formed through transfer of reactive species from a gas phase to the surface of the substrate, diffusion in the surface of the substrate, and deposition. In order to ensure sufficient surface diffusion and chemical bonding at a stable site, it is preferable that $SiH_3$ radicals serve as the reactive species when the lifetime of the radicals is taken into consideration. When various radicals such as SiH or $SiH_2$ serve as the reactive species, reaction modes on the surface are complicated. This may increase the defect density. Accordingly, it is preferable that only the $SiH_3$ radicals serve as the reactive species. The density of the SiH or $SiH_2$ radicals increases due to various possible reasons. For example, an increased electron density may cause depletion of the $SiH_4$ gas in the plasma atmosphere, which lowers secondary reactions between $SiH_4$ and the radicals such as SiH and $SiH_2$. Consequently, a depletion rate decreases for the radicals such as SiH and $SiH_2$. In order to prevent the density of the radicals such as SiH and $SiH_2$ from being increased in an atmosphere having a higher electron density in plasma, the gas should be introduced in such a manner that the reduction in $SiH_4$ density can be controlled in the plasma atmosphere.

In a high frequency plasma CVD using a source gas containing fluorinated silicon and hydrogen in the source gas, active species, such as $SiF_nH_m$ ($0 \leq n$, $m \leq 4$), HF, F, and H, may be generated. The plasma atmosphere containing these active species are characterized in that there are some active species contributing to etching in addition to active species contributing to deposition of the silicon-based thin film. Thus, it would be possible to form a silicon-based thin film with a high crystallization degree that has fewer amorphous regions while etching the Si—Si bond having a relatively weak bonding force on the film surface. In the course of the etching, radicals are produced along with the cleavage of the bonding. This promotes relaxation of the structure. Therefore, it is expected that a better silicon-based thin film can be formed at a lower process temperature. In this system, high-speed film deposition would be possible by means of forming fluorinated silane-based active species containing hydrogen, such as $SiF_2H$ and $SiFH_2$, that are formed by adding hydrogen to fluorinated silicon. In order to form the fluorinated silane-based active species containing hydrogen, such as $SiF_2H$ and $SiFH_2$, it is important that the fluorinated silicon is decomposed effectively to form SiF. Furthermore, an active reaction process between the formed SiF and the activated hydrogen would also be important. In particular, it is especially important that the plasma contains sufficient SiF therein. A silicon-based oriented thin film may be formed at a high deposition rate in total during deposition and etching. To this end, control of the plasma process is a key technical factor. For the active reaction process between SiF and the activated hydrogen, it is important that the plasma density increases per the unit volume of the discharge space as described above. In an atmosphere where the plasma has an increased electron density, more activated hydrogen may be formed. To this end, it is necessary to introduce the source gas so that depletion of $H_2$ gas is restricted. If the density of the radicals, such as SiH and $SiH_2$, is increased in the plasma, the radicals tend to serve as crystallization nuclei in the discharge space and on the surface of the deposition film. This means that they become an inhibitory factor against formation of reaction by-products such as polysilane and enlargement of the grain diameter. With this respect, it is necessary to limit the density of the radicals such as SiH and $SiH_2$. In order to achieve the above, the following are considered to be effective: supplying fresh source gases aggressively and causing extensive secondary reactions that promote removal of the radicals such as SiH and $SiH_2$ decomposing the source gas.

Considering from the above-mentioned way of reaction, that is, the way of reaction that does not cause depletion of the $SiH_4$ and $H_2$ gases, it is suggested that plasma having a desired plasma atmosphere can be generated by means of focusing on a residence time $\tau$ (sec) as a parameter to control the plasma. The residence time is defined by the equation $\tau = 592 \times V \times P/Q$, wherein V represents a volume ($m^3$) of the discharge space generated by the plasma, Q represents a flow rate ($cm^3$/min. (normal)) of the source gas, and P represents a pressure (Pa) of the discharge space. In order to provide a silicon-based thin film of high quality, it would be necessary to control the residence time in addition to the above-mentioned parameters such as the pressure and the distance between the high frequency input unit and the substrate.

Taking the above into consideration, the present inventors carried out extensive research. As a result, the present inventor found that, in order to deposit a silicon-based thin film having a lower defect density and excellent properties at a high rate, it is possible to restrict the radical density in the plasma and to form the desired silicon-based thin film in the region that satisfies the following: the distance between the high frequency input unit and the substrate is equal to or larger than 3 mm but not larger than 30 mm; the pressure in the discharge space is equal to or higher than 100 Pa (0.75 Torr) but not higher than 5,000 Pa (37.5 Torr); the residence time $\tau$ is equal to or longer than 0.01 seconds but not longer than 10 seconds when defined by the equation $\tau = 592 \times V \times P/Q$, wherein V represents the volume ($m^3$) of the discharge space generated by the plasma, Q represents the flow rate ($cm^3$/min. (normal)) of the source gas, and P represents the pressure (Pa) of the discharge space. The formation method based on the CVD technique using high frequency waves of 10 MHz to 10 GHz is preferable as described above. The formation method based on the CVD technique using high frequency waves of 20 MHz to 300 MHz is particularly preferable because it is easy to control the temperature of electrons in the plasma and to form uniform plasma over a large area. The density per each discharge space generated by the plasma of high applied frequencies is preferably in a range between 0.01 W/$cm^3$ and 2 W/$cm^3$, both inclusive.

In forming devices such as photovoltaic devices, the above-mentioned range makes it possible to inhibit any changes of ingredients, film quality, and other properties, which otherwise would be caused due to a reduction reaction by the hydrogen in the plasma atmosphere, and to eliminate adverse effects on a base. This approach is particularly effective when an electrically conductive transparent film formed of an oxide of a metal such as zinc oxide is used as a base layer because it makes it possible to prevent a decrease in transmittance of the electrically conductive transparent film due to the reduction and associated deterioration of the properties of the photovoltaic device.

As another operation, adhesion between the silicon-based thin film and the base layer is improved. This effect is expected to be achieved because the extensive surface diffusion of $SiH_3$, $SiF_2H$, and $SiFH_2$ radicals results in formation of the deposition films while alleviating stress deformations near the surface. In addition, the partial pressure of the hydrogen rises effectively. As a result, in the silicon-based thin film containing the crystalline phase, more passivation effect can be achieved at the grain boundaries and deactivation of the grain boundaries is promoted. Sudden release of the hydrogen atoms entrapped in the silicon network is inhibited. It is possible to inhibit a plastic flow which is caused due to generation of an irregular zone in the silicon network, and associated cracks and aggregations. Therefore, it is possible to produce a silicon-based thin film having good film qualities and good adhesion. A configuration with this silicon-based thin film can provide a photovoltaic device which is superior in weather-resisting properties.

Considering the effects on the base layer, the adhesion, the weather-resisting properties, and lowering a photo-degradation rate, preferable ranges would lie in: the residence time of 0.1 to 3 seconds and the density per each discharge space generated by the applied high frequency plasma of 0.1 W/cm$^3$ to 1 W/cm$^3$.

It is preferable that the above-mentioned silicon-based thin films contain at least one of oxygen atoms, carbon atoms, or nitrogen atoms because the atom or atoms are placed at the grain boundaries or in the voids formed in the amorphous structure and improve stability in structure. In the silicon-based thin film containing the crystalline phase, increase in resistance of the grain boundaries makes it possible to restrict generation of a leak current. Though details of the reason thereof are unknown, it restricts formation of a new crystal nucleus on the growing surface, which has an effect of improving uniformity of the cross-sectional size of the microcrystals. These effects appear effectively when the total amount of the oxygen atoms, the carbon atoms, and/or nitrogen atoms is equal to or larger than 1.5×10$^{18}$ atoms/cm$^3$. With an excessive amount in total of the oxygen atoms, the carbon atoms, and/or nitrogen atoms, the atoms are entrapped in the bulk of the microcrystals, deteriorating the crystallization properties. A preferable range of the total amount of the oxygen atoms, the carbon atoms, and/or nitrogen atoms is not larger than 5.0×10$^{19}$ atoms/cm$^3$.

When the silicon-based thin film contains a fluorine atom or atoms, passivation takes place efficiently in a misalignment structure region having an amorphous structure. The more electrically negative fluorine atoms deactivate the dangling bonds of the silicon atoms which appears around the grain boundaries of the microcrystals. The amount of the fluorine atoms is preferably in a range between 1.0×10$^{19}$ atoms/cm$^3$ and 2.5×10$^{20}$ atoms/cm$^3$.

A photovoltaic device is used as an example of the semiconductor device of the present invention and components thereof are described below.

FIG. 1 is a schematic cross-sectional view showing an example of a photovoltaic device according to the present invention. In FIG. 1, the photovoltaic device comprises a substrate 101, a semiconductor layer 102, a second electrically conductive transparent layer 103, and a collector electrode 104. The substrate 101 is formed of a substrate body 101-1, a metal layer 101-2, and a first electrically conductive transparent layer 101-3.

Substrate Body

The substrate body 101-1 may suitably be formed of a plate member or a sheet member of metals, resins, glass, ceramics, or semiconductor bulks. The surfaces of the substrate body may have fine irregularities. A transparent substrate body may be used to allow the incident of light from the side of the substrate body. In addition, a continuous deposition process may be applied using a roll-to-roll technique when the substrate body 101-1 has an elongated shape. In particular, stainless steel and flexible materials such as polyimide are suitable as a material of the substrate body 101-1.

Metal Layer

The metal layer 101-2 serves as an electrode and as a reflective layer from which the light reached to the substrate body 101-1 is reflected for recycled use by the semiconductor layer 102. Suitable materials for the metal layer 101-2 include Al, Cu, Ag, Au, CuMg, AlSi and the like. The metal layer 101-2 is preferably formed by a method such as vapor deposition, sputtering, electrocrystallization, and printing. The metal layer 101-2 preferably has irregularities on the surfaces thereof. The irregularities serve to extend the optical path within the semiconductor layer 102 and to increase a short-circuit current. When the substrate body 101-1 has an electrical conductivity, the metal layer 101-2 is not necessarily formed.

First Electrically Conductive Transparent Layer

The first electrically conductive transparent layer 101-3 serves to enhance diffuse reflection of the incident light and the reflected light and to extend the optical path within the semiconductor layer 102. In addition, the first electrically conductive transparent layer 101-3 serves to prevent the elements of the metal layer 101-2 from diffusing or migrating into the semiconductor layer 102 which otherwise causes shunt of the photovoltaic device. The first electrically conductive transparent layer 101-3 has an appropriate resistance. This prevents short-circuit due to a defect, such as pin holes, of the semiconductor layer 102. Furthermore, the first electrically conductive transparent layer 101-3 preferably has irregularities on the surface thereof as in the metal layer 102. The first electrically conductive transparent layer 101-3 is preferably formed of an electrically conductive oxide such as ZnO and ITO. It is preferable that the first electrically conductive transparent layer 101-3 be formed by a method such as vapor deposition, sputtering, CVD, and electrocrystallization. A substance that changes the electric conductivity may be added to the electrically conductive oxide.

A zinc oxide layer is preferably formed by a method such as sputtering and electrocrystallization, or by a combination of these methods.

Conditions to form the zinc oxide film by the sputtering are significantly affected by the process used, the type and the flow rate of the gas, the internal pressure, the applied power, the deposition rate, and the temperature of the substrate. For example, when the zinc oxide film is formed using a zinc oxide target by DC magnetron sputtering, the gas may be Ar, Ne, Kr, Xe, Hg, or O$_2$. The flow rate is, though depending on the size and the gas discharge rate, desirably from 1 sccm to 100 sccm for a deposition space of a 20-liter volume. The internal pressure during the deposition is desirably between 1×10$^{-4}$ Torr and 0.1 Torr. The applied power is, though depending on the size of the target, desirably from 10 W to 100 KW for the diameter of 15 cm. The temperature of the substrate is between 70° C. and 450° C. for the deposition rate of 1 μm/h though a preferable range depends on the deposition rate.

Conditions to form the zinc oxide film by the electrocrystallization preferably use an aqueous solution containing an nitrate ion or an zinc ion prepared in a corrosion-resistant vessel. The concentration of the nitrate ion and/or the zinc ion is desirably in a range between 0.001 mol/l and 1.0 mol/l. It is more desirable that the concentration is in a range between 0.01 mol/l and 0.5 mol/l. It is yet more desirable that the concentration is in a range between 0.1 mol/l and 0.25 mol/l. A source of the nitrate ion and the zinc ion is not particularly limited. For example, zinc nitrate, which serves as a source of both ions may be used. Alternatively, the source may be a mixture of a water-soluble nitrate such as ammonium nitrate, which serves as the source of the nitrate ion, and a zinc salt such as zinc sulfate which serves as the source of the zinc ion. A carbohydrate may preferably be added to the aqueous solution for the purpose of inhibiting an abnormal growth or improving adhesion. The type of the carbohydrate is not particularly limited. Examples of the applicable carbohydrate include monosaccharides such as glucose and fructose, disaccharides such as maltose and saccharose, and polysaccharides such as dextrin and starch, and a mixture thereof. The amount of the carbohydrate contained in the aqueous solution depends on the type thereof and is desirably in a range between 0.001 g/l and 300 g/l, more desirably in a range between 0.005 g/l and 100 g/l and yet more desirably in a range between 0.01 g/l and 60 g/l. When the zinc oxide film is deposited by the electrocrystallization, the substrate body on which the zinc oxide film is deposited is used as a cathode electrode and the substance such as zinc, platinum, and carbon is used as an anode in the aqueous solution. A current density across a load resistance is preferably from 10 mA/dm to 10 A/dm.

Substrate

The metal layer 101-2, if necessary, and the first electrically conductive transparent layer 101-3 are laminated on the substrate body 101-1 to form the substrate 101 in the manner described above. For the purpose of facilitating integration of the cell, an insulation layer may be provided in the substrate 101 as an intermediate layer.

Semiconductor Layer

Silicon (Si) is used as the major material of the semiconductor layer 102 a part of which is formed by the silicon-based thin film of the present invention. In addition to Si, an alloy of Si and C or Ge may be used. The semiconductor layer contains a group III element when it is configured as a p-type semiconductor layer and contains a group V element when it is configured as an n-type semiconductor layer. As to the electrical properties of the p-and n-type layers, those having an activation energy of not higher than 0.2 eV are preferable, and those having an activation energy of not higher than 0.1 eV are optimum. A specific resistance of not higher than 100 Ωcm is preferable and that of not higher than 1 Ωcm is optimum. In the case of a stacked cell (i.e., a photovoltaic device having a plurality of pin junctions), it is preferable that the i-type semiconductor layers of the pin junction closer to the light incident side have a large band gap while the band gap becomes narrower for the farther pin junction. A crystalline semiconductor having a low light absorption or a semiconductor having a large band gap is suitable for a doping layer (a p-type layer or an n-type layer) on the light incident side.

Figure 3:
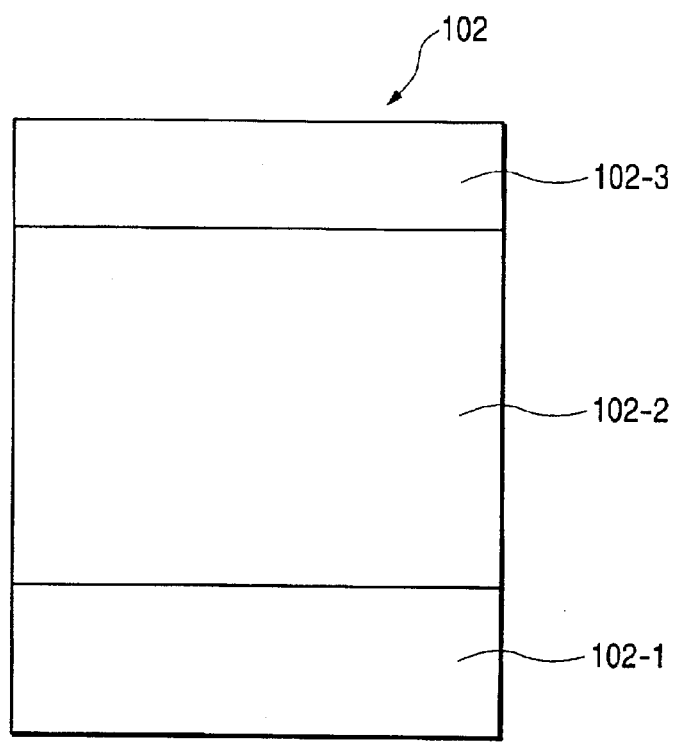
FIG. 3 is a schematic cross-sectional view showing an example of a semiconductor layer including a semiconductor device according to the present invention.

The semiconductor layer 102 which is a component of the present invention is described further. FIG. 3 is a schematic cross-sectional view showing the semiconductor layer 102 having a pair of pin junctions as an example of the photovoltaic device of the present invention. In FIG. 3, the semiconductor layer 102 comprises a semiconductor layer 102-1 having a first conductive type, on which an i-type semiconductor layer 102-2 formed of the silicon-based thin film of the present invention and a semiconductor layer 102-3 having a second conductive type are laminated. In the semiconductor layer having two or more pin junctions, it is preferable that at least one of the pin junctions be configured to have the above-mentioned structure.

Examples of a stacked cell having two pairs of pin junctions laminated on top of each other include combinations of the i-type silicon-based semiconductor layers, i.e., a combination of an amorphous silicon semiconductor layer and a silicon semiconductor layer containing microcrystals laminated in this order from the light incident side, and a combination of a silicon semiconductor layer containing microcrystals and a silicon semiconductor layer containing microcrystals, laminated in this order from the light incident side. Examples of a photovoltaic device having three pairs of pin junctions laminated on top of each other include combinations of the i-type silicon-based semiconductor layers, i.e., a combination of an amorphous silicon semiconductor layer, a silicon semiconductor layer containing microcrystals, and a silicon semiconductor layer containing microcrystals, and a combination of an amorphous silicon semiconductor layer, a silicon semiconductor layer containing microcrystals, and an amorphous silicon germanium semiconductor layer. The i-type semiconductor layer may preferably have the following parameters: a light absorption coefficient ($\alpha$) at 630 nm: 5,000 cm$^{-1}$ or larger; a photoconductivity ($\sigma p$): $10 \times 10^{-5}$ S/cm or higher when exposed to artificial solar energy produced from a solar simulator (AM 1.5, 100 mW/cm$^2$); a dark conductivity ($\sigma d$): $10 \times 10^{-6}$ S/cm or lower: and an Urbach energy by the constant photocurrent method (CPM): 55 meV or lower. A slightly p-type or n-type semiconductor may be used as the i-type semiconductor layer. When a silicon germanium semiconductor layer is used for the i-type semiconductor layer, the i-type semiconductor layer containing no germanium may be inserted into either one of a p/i interface or an n/i interface in order to reduce an interface potential and to rise an open circuit voltage.

Method for Producing Semiconductor Layers

A high frequency plasma CVD technique is suitable to produce the silicon-based thin film and the semiconductor layer 102 of the present invention. A suitable example of a procedure to produce the semiconductor layer 102 using the high frequency plasma CVD technique is described below.

The pressure of a vacuum vessel for the production of semiconductors is reduced to attain a predetermined deposition pressure. A source gas and feedstock gases such as dilution gases are introduced into a deposition chamber. The deposition chamber is evacuated using a vacuum pump to establish the predetermined deposition pressure in the deposition chamber.

The substrate 101 is heated at a predetermined temperature by using a heater.

High frequency waves oscillated by a high frequency power source are introduced into the deposition chamber. The high frequency waves may be introduced in various ways. When the high frequency waves are achieved as microwaves, a conduit may be used to guide them into the deposition chamber through a dielectric window such as silica, alumina, or aluminum nitride. Alternatively, when the high frequency waves are achieved as VHFs or RFs, a coaxial cable may be used to guide them into the deposition chamber through metal electrodes.

The plasma is generated in the deposition chamber and the source gas is separated to form a deposition film on the substrate 101 placed in the deposition chamber. The above-mentioned procedures are repeated a number of times necessary to form the semiconductor layer 102.

Suitable conditions for the production of the semiconductor layer 102 are: the substrate temperature of 100 to 450° C. in the deposition chamber, the pressure of 0.067 Pa (0.5 mTorr) to $1.5 \times 10^4$ Pa (113 Torr), and a high frequency power density of 0.001 to 2 W/cm$^3$. In forming the silicon-based thin film of the present invention, it is preferable that temperature gradients exist within the substrate in the thickness direction thereof during the formation of the silicon-based thin film and when the temperature gradient shows that the deposition surface of the substrate has a higher temperature than the backside, or when the direction of the temperature gradient is reversed during the formation of the silicon-based thin film. It is preferable that a value of the temperature gradient be in a range between 500° C./m and 100,000° C./m, both inclusive, with the value being defined by C=ΔT/d wherein d represents a thickness of the substrate and ΔT represents a temperature difference between the deposition surface of the substrate and the backside thereof. Furthermore, it is necessary that the distance between the high frequency input unit and the substrate is equal to or larger than 3 mm but not larger than 30 mm; the pressure in the discharge space is equal to or higher than 100 Pa (0.75 Torr) but not higher than 5,000 Pa (37.5 Torr); the residence time τ is equal to or longer than 0.01 seconds but not longer than 10 seconds when defined by the equation τ=592×V× P/Q, wherein V represents the volume (m$^3$) of the discharge space generated by the plasma, Q represents the flow rate (cm$^3$/min. (normal)) of the source gas, and P represents the pressure (Pa) of the discharge space. The high frequency power density is preferably in a range between 0.01 W/cm$^3$ and 2 W/cm$^3$, both inclusive.

Figure 10:
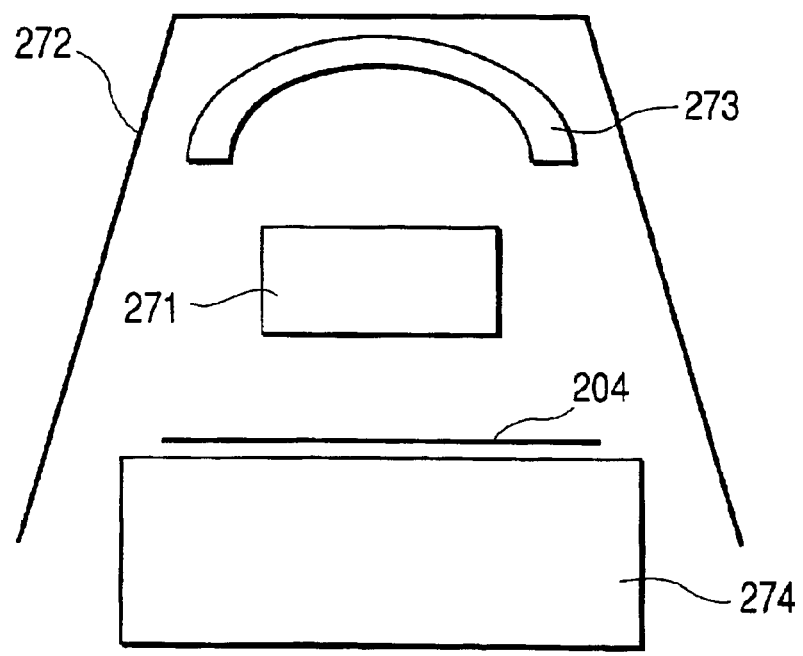
FIG. 10 is a schematic cross-sectional view showing examples of a heat reflecting hood and a domed heat reflector.

In order to provide the temperature gradients across the substrate of the present invention in the thickness direction thereof, a preferable procedure involves heating and cooling from the side of the deposition surface of the substrate and the backside thereof. The heating may preferably be performed by means of directly or indirectly heating the substrate from the side of the deposition surface and the backside independently, using heat inductor sections, such as resistance heaters or lamp heaters, placed on both sides of the substrate. The deposition surface of the substrate may be heated using a high frequency input unit placed opposite to the substrate. Alternatively, the deposition chamber that defines the deposition space may be heated to indirectly heat the substrate. In addition, the plasma serves as a heating source. The cooling may preferably be performed by means of placing a cooling pipe through which constant temperature water, oil, or gas is flown and the pipe acts on the substrate directly or indirectly. Alternatively, a metal block may act directly or indirectly on the substrate in which the cooling pipe is embedded in a metal block. The cooling block may have an irregular surface on the side opposing to the substrate to increase a surface area. Such a block may be particularly useful when the temperature gradient should be relatively large because the block can provide better thermal absorption effects. The surfaces of the material forming the cooling block and/or the cooling pipe may be black-colored to promote absorption of light components of the infrared and far infrared regions. A heat reflecting hood or a domed heat reflector made of, for example, aluminum may be used in the cooling block to collect the radiation heat effectively. FIG. 10 shows an example of a configuration of a heat reflecting hood and a domed heat reflector, in which the direction along which the substrates are conveyed corresponds to the vertical direction on the sheet.

It is also preferable that temperature adjustment means be used that combines the heating means and the cooling means.

In particular, to adjust the temperature adjustment means that combines the heating means and the cooling means is an example of a preferable approach to reverse the direction of the temperature gradient in forming the silicon-based thin film. The temperature gradient may be varied stepwise or continuously.

The source gas suitable to form the silicon-based thin film and the semiconductor layer 102 of the present invention include fluorinated silicon such as $SiF_4$, $SiH_2F_2$, $SiH_3F$, and $Si_2F_6$; fluorinated silicon compounds such as $SiH_4$ and $Si_2H_6$; and, if the source gas is based on an alloy, vaporizable compounds containing Ge or C, such as $GeH_4$ and $CH_4$, which are introduced into the deposition chamber after being diluted with a hydrogen gas. An inert gas such as He may be added. A p-type dopant gas used to produce a p-type semiconductor layer may be $B_2H_6$ and $BF_3$. Likewise, an n-type dopant gas used to produce an n-type semiconductor layer may be $PH_3$ and $PF_3$. It is preferable that the ratio of the dilution gas to the source gas be increased to introduce high frequencies having a relatively high power density, when thin films with the crystalline phase, layers having a low light absorption such as SiC or layers having large band gaps are deposited.

Second Electrically Conductive Transparent Layer

The second electrically conductive transparent layer 103 shown FIG. 1 is an electrode on the light incident side. It also serves as an anti-reflection film by means of appropriately adjusting the film thickness thereof. The second electrically conductive transparent layer 103 is required to have a high transmittance at frequency regions that the semiconductor layer 102 can absorb, and to have a low resistivity. The transmittance at 550 nm is preferably not lower than 80%, and more preferably, not lower than 85%. The resistivity is preferably not higher than 5×10$^{-3}$ Ωcm, and more preferably, not higher than 1×10$^{-3}$ Ωcm. ITO, ZnO, and $In_2O_3$ may suitably be used as a material for the second electrically conductive transparent layer 103. The second electrically conductive transparent layer 103 is preferably formed by a method such as vapor deposition, CVD, spraying, spin-on, and immersion. A substance that changes the electric conductivity may be added to the material(s).

Collector Electrode

The collector electrode 104 is disposed on the transparent electrode 103 as shown in FIG. 1 in order to improve the collection efficiency. The collector electrode 104 may suitably be formed by a method involving, for example, formation of metal electrode patterns by sputtering using a mask, printing of electrically conductive paste or solder paste, or fixation of metal leads with electrically conductive paste.

If necessary, protective layers may be formed on both sides of the photovoltaic device. At the same time, a reinforcing member such as a steel plate may be used on the back (opposite to the light incident side) of the photovoltaic device.

EXAMPLES

In the following examples, the present invention is described specifically in conjunction with a solar cell and a thin-film transistor (TFT) as the semiconductor device. However, these examples do not limit the scope of the present invention.

Example 1

Figure 4:
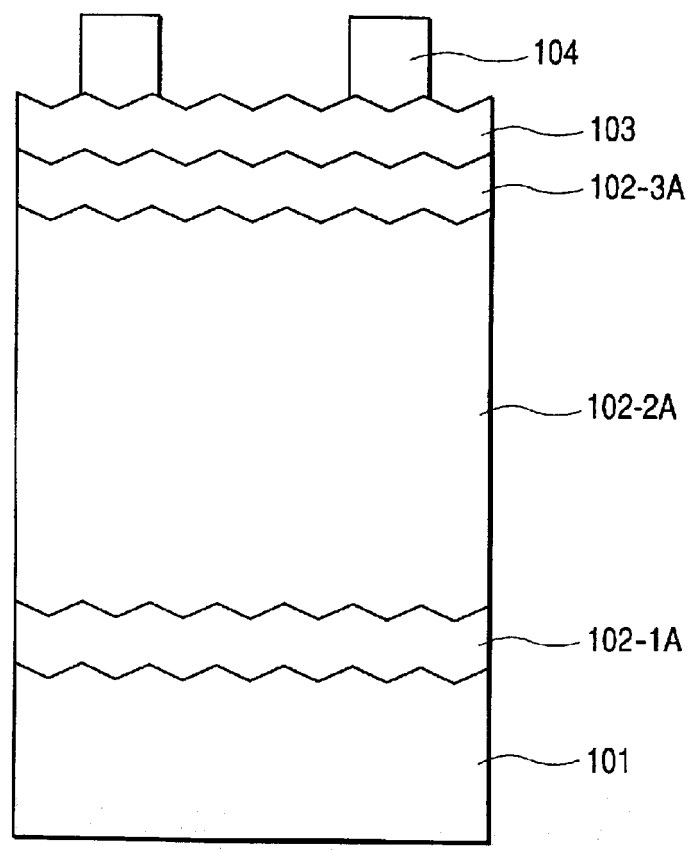
FIG. 4 is a schematic cross-sectional view showing an example of a photovoltaic device including a semiconductor device according to the present invention.

A photovoltaic device shown in FIG. 4 was produced in the following manner using a film deposition system 201 shown in FIG. 2A. FIG. 4 is a schematic cross-sectional view showing an example of a photovoltaic device including silicon-based thin films according to the present invention. In FIG. 4, similar members and components to those in FIG.

1 are depicted by like reference numerals and description thereof will be omitted. The semiconductor layer of this photovoltaic device comprises an amorphous n-type semiconductor layer 102-1A, a microcrystal i-type semiconductor layer 102-2A, and a microcrystal p-type semiconductor layer 102-3A. Thus, the illustrated photovoltaic device is a so-called pin-type single cell photovoltaic device.

Figure 2A:
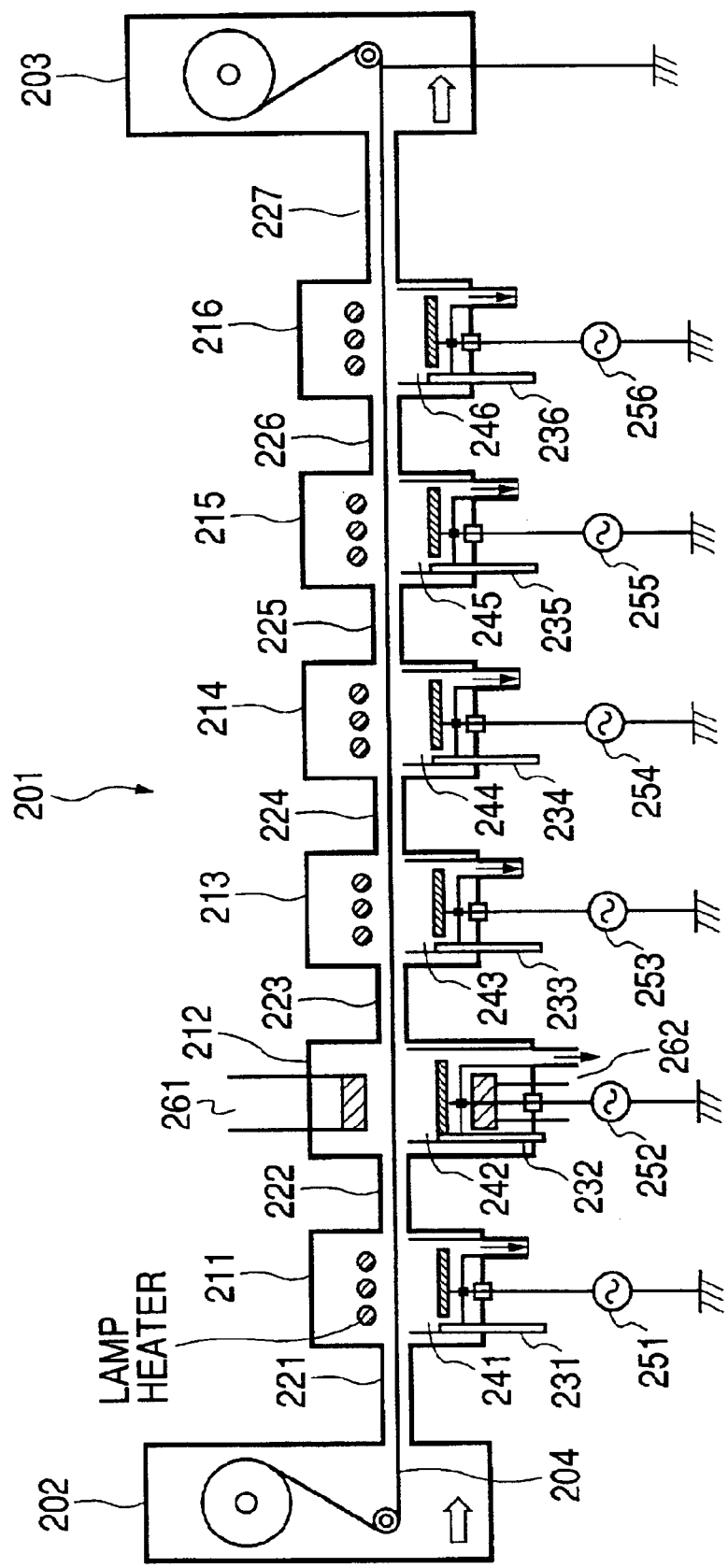

FIG. 2A is a schematic cross-sectional view showing an example of a film deposition system which is used to produce a silicon-based thin film and a photovoltaic device according to the present invention. The film deposition system 201 shown in FIG. 2A comprises a substrate unwinding chamber 202, vacuum vessels for semiconductor formation 211 to 216, and a substrate winding chamber 203, which are connected to each other via gas gates 221 to 227. A strip of electrically conductive substrate 204 travels through the chambers and the gas gates in the film deposition system 201. The strip of electrically conductive substrate 204 is unwound from a bobbin in the substrate unwinding chamber 202 and wound onto another bobbin in the substrate winding chamber 203.

Each of the vacuum vessels for semiconductor formation 211 to 216 comprises a deposition chamber where a plasma generation region is produced. The deposition chamber includes a discharge space in which the plasma is generated. The discharge space is defined by the electrically conductive substrate and the high frequency input unit on the upper and lower sides thereof, respectively. The lateral sides of the discharge space are defined by discharge plates which are disposed to surround the high frequency input unit.

High frequency power sources 251 to 256 apply high frequency power to flat-plate shaped high frequency input units 241 to 246, respectively, in the deposition chambers to generate glow discharge. This decomposes the source gas. Thus, a semiconductor layer is deposited on the electrically conductive substrate 204. The high frequency input units 241 to 246 are opposed to the electrically conductive substrate 204 and each comprises a height adjustment mechanism which is not shown. The height adjustment mechanism allows adjustment of the distance between the electrically conductive substrate and the high frequency input unit. At the same time, the volume of the discharge space can be adjusted. The vacuum vessels for semiconductor formation 211 to 216 are connected to gas inlet pipes 231 to 236, respectively.

The film deposition system 201 shown in FIG. 2A comprises six vacuum vessels for semiconductor formation. On the other hand, in the following examples, it is unnecessary to generate the glow discharge in all vacuum vessels for semiconductor formation. Instead, the glow discharge can be selectively generated in each chamber according to the layer configuration of the photovoltaic device to be fabricated. In addition, each vacuum vessel for semiconductor formation comprises a deposition region adjustment plate (not shown) for adjusting a contact area between the electrically conductive substrate 204 and the discharge space in the deposition chamber.

Figure 6:
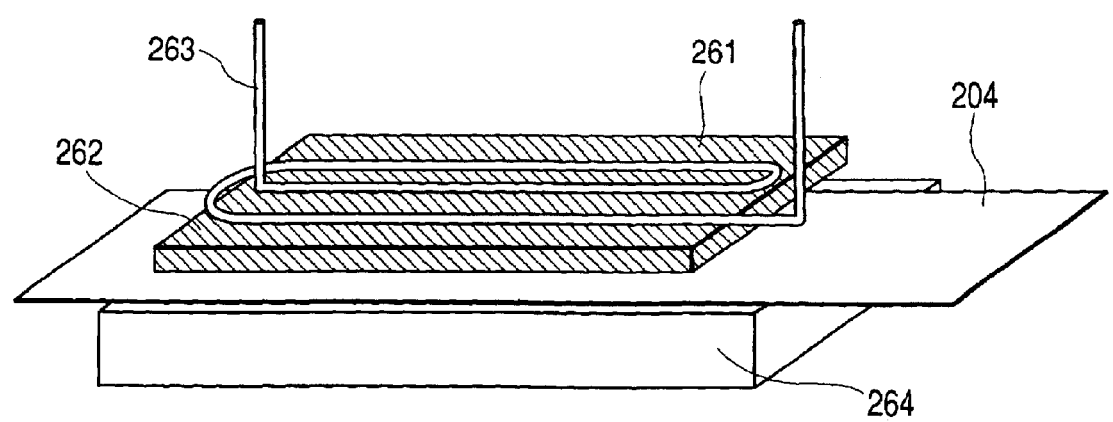
FIG. 6 is a schematic view of a heater with a cooling tube.

In the vacuum vessel for semiconductor formation 212, heaters 261 and 262 each equipped with a cooling pipe 263 and a discharge plate 264, as shown in FIG. 6, are provided on the backsides of the electrically conductive substrate 204 and the high frequency input unit 242. The remaining vacuum vessels for semiconductor formation have a lamp hater on the backside of the electrically conductive substrate 204 to allow temperature control of the electrically conductive substrate 204.

Prior to the production of photovoltaic devices, crystallization properties of the silicon-based thin films were confirmed. A strip of stainless steel (SUS 430-BA) substrate body (50 cm wide, 200 m long, and 0.125 mm thick) was degreased thoroughly, washed, and loaded onto a continuous sputtering apparatus (not shown). A Ag thin film of 100 nm in thickness was sputtered using Ag electrodes as a target. Then, a ZnO thin film of 1.2 $\mu$m in thickness was sputtered on the Ag thin film using a ZnO target to form the strip of the electrically conductive substrate 204.

A bobbin with the electrically conductive substrate 204 wounded thereon was loaded into the substrate unwinding chamber 202. The electrically conductive substrate 204 is passed through the gas gate on the input side, the vacuum vessels for semiconductor formation 211, 212, 213, 214, 215, and 216, the gas gate on the output side, to the substrate winding chamber 203. The tension was applied to the strip of electrically conductive substrate 204 so that it is not loosened. The substrate unwinding chamber 202, the vacuum vessels for semiconductor formation 211, 212, 213, 214, 215, and 216, and the substrate winding chamber 203 were evacuated thoroughly to a pressure not higher than $6.7 \times 10^{-4}$ Pa ($5 \times 10^{-6}$ Torr) by using a vacuum evacuation system formed of a vacuum pump which is not shown.

Next, the source gas and the dilution gas were supplied through the gas inlet pipe 232 to the vacuum vessel for semiconductor formation 212 while operating the vacuum evacuation system. The deposition chamber of the vacuum vessel for semiconductor formation 212 has a length of 1 m in the longitudinal direction and a width of 50 cm. The vacuum vessels for semiconductor formation other than the vacuum vessel for semiconductor formation 212 were supplied with an $H_2$ gas through the gas inlet pipes at a flow rate of 200 cm$^3$/min. (normal). Likewise, the gas gates were supplied with the $H_2$ gas as a gate gas through respective gate gas supply pipes (not shown) at a flow rate of 500 cm$^3$/min. (normal). At this point, the evacuation capacity of the vacuum evacuation system was controlled to adjust the pressure in the vacuum vessel for semiconductor formation 212 to a predetermined pressure. Deposition conditions are given in the row "Deposition Conditions for 212" in Table 1 below.

The heater with cooling pipe 261 and the heater with cooling pipe 262 were controlled so that a predetermined temperature gradient is given between the deposition surface side of the substrate and the backside thereof through combined effects of the heaters and the cooling air flowing through the cooling pipes.

The strip of electrically conductive substrate 204 was initiated to travel from the substrate unwinding chamber 202 to the substrate winding chamber 203 when the pressure in the vacuum vessel for semiconductor formation 212 was stabilized.

Subsequently, high frequency waves were introduced into the high frequency input unit 242 in the vacuum vessel for semiconductor formation 212 by the high frequency power source 252. The height adjustment mechanism achieved the distance of 9 mm between the electrically conductive substrate and the high frequency input unit to produce glow discharge in the deposition chamber within the vacuum vessel for semiconductor formation 212. Thus, a silicon-based thin film of 2 $\mu$m was formed on the electrically conductive substrate 204. In this event, high frequency waves of 60 MHz were introduced into the vacuum vessel for semiconductor formation 212 while controlling the power density to 400 mW/cm$^3$ using the high frequency input unit 242 formed of an aluminum electrode (Example 1-1).

Then, the Example 1-1 was repeated to form a silicon-based thin film except that the temperature of the substrate was set to 350° C. on both the deposition sides and the backside (Comparative Example 1-1).

Diffraction peaks of the resulting silicon-based thin films were measured using an x-ray diffractometer. Though the silicon-based thin films of the Example 1-1 and the Comparative Example 1-1 were predominantly oriented to the (220) plane, it was found that the silicon-based thin film of the Example 1-1 exhibited higher diffraction peak intensity of the (220) plane relative to the total diffraction intensity obtained for the eleven reflections from a small angle side and also exhibited smaller half bandwidth of the diffraction peak. The thin film of the Example 1-1 was found to be superior in the orientation of the (220) plane and crystallization properties and to have a larger grain diameter.

Next, a photovoltaic device was produced. The source gas and the dilution gas were supplied to the vacuum vessels for semiconductor formation 211, 212, and 213 through the gas inlet pipes 231, 232, and 233, respectively, while operating the vacuum evacuation system. A discharge chamber of the vacuum vessel for semiconductor formation 212 has a length of 1 m in the longitudinal direction and a width of 50 cm. The vacuum vessels for semiconductor formation other than the vacuum vessels for semiconductor formation 211, 212, and 213 were supplied with an $H_2$ gas through the gas inlet pipes at a flow rate of 200 cm$^3$/min. (normal). Likewise, the gas gates were supplied with the $H_2$ gas as a gate gas through respective gate gas supply pipes (not shown) at a flow rate of 500 sccm. At this point, the evacuation capacity of the vacuum evacuation system was controlled to adjust the pressure in the vacuum vessels for semiconductor formation 211, 212, and 213 to a predetermined pressure. Deposition conditions are given in Table 1 below. The temperature used to form the microcrystal i-type semiconductor layer was identical to that for the Example 1-1.

The strip of electrically conductive substrate 204 was initiated to travel from the substrate unwinding chamber 202 to the substrate winding chamber 203 when the pressures in the vacuum vessels for semiconductor formation 211, 212, and 213 were stabilized.

Subsequently, high frequency waves were introduced into the high frequency input units 241, 242, and 243 in the vacuum vessels for semiconductor formation 211, 212, and 213 by the high frequency power sources 251, 252, and 253, respectively. The glow discharge was produced in the deposition chamber within each of the vacuum vessels for semiconductor formation 211, 212, and 213. Thus, an amorphous n-type semiconductor layer (30 nm thick), a microcrystal i-type semiconductor layer (1.5 μm thick), and a microcrystal p-type semiconductor layer (10 nm thick) were formed on the electrically conductive substrate 204 to produce a photovoltaic device.

A high frequency power having a frequency of 13.56 MHz and a power density of 5 mW/cm$^3$ was introduced into the vacuum vessel for semiconductor formation 211 using the high frequency input unit 241 formed of an aluminum electrode. Likewise, the high frequency power was introduced into the vacuum vessel for semiconductor formation 212 as in the Example 1-1. A high frequency power having a frequency of 13.56 MHz and a power density of 30 mW/cm$^3$ was introduced into the vacuum vessel for semiconductor formation 213 using the high frequency input unit 243 formed of an aluminum electrode.

Subsequently, a continuous modularization system (not shown) was used to form the resulting strips of photovoltaic device into a solar cell module of 36 cm by 22 cm (Example 1-2).

Then, the Example 1-2 was repeated to form a solar cell module except that the temperature of the substrate was set to 350° C. on both the deposition sides and the backside (Comparative Example 1-2).

Efficiencies of photoelectric conversion of the resulting solar cell modules were measured by using a solar simulator (AM 1.5, 100 mW/cm$^2$). As a result, it was found that the solar cell module of the Example 1-2 has 1.15 times higher efficiency of photoelectric conversion than the solar cell of the Comparative Example 1-2.

The above result indicates that the solar cell including the semiconductor device of the present invention has good properties.

Example 2

A photovoltaic device shown in FIG. 4 was produced in the following manner using the film deposition system 201 shown in FIG. 2A. FIG. 4 is a schematic cross-sectional view showing an example of a photovoltaic device including silicon-based thin films according to the present invention. In FIG. 4, similar members and components to those in FIG. 1 are depicted by like reference numerals and description thereof will be omitted. The semiconductor layer of this photovoltaic device comprises an amorphous n-type semiconductor layer 102-1A, a microcrystal i-type semiconductor layer 102-2A, and a microcrystal p-type semiconductor layer 102-3A. Thus, the illustrated photovoltaic device is a so-called pin-type single cell photovoltaic device.

Subsequently, high frequency waves were introduced into the high frequency input units 241 to 243 in the vacuum vessels for semiconductor formation 211 to 213 by the high frequency power sources 251 to 253, respectively. The glow discharge was produced in the deposition chamber within each of the vacuum vessels for semiconductor formation 211 to 213. Thus, an amorphous n-type semiconductor layer (30 nm thick), a microcrystal i-type semiconductor layer, and a microcrystal p-type semiconductor layer (10 nm thick) were formed on the electrically conductive substrate 204 to produce a photovoltaic device. The formation of the microcrystal i-type semiconductor layer was performed while changing the film thickness by means of adjusting the deposition region adjustment plate.

The heater with cooling pipe 261 and the heater with cooling pipe 262 were controlled so that a predetermined temperature gradient is given between the deposition surface side of the substrate and the backside thereof through combined effects of the heaters and the cooling air flowing through the cooling pipes.

Deposition conditions for the vacuum vessels for semiconductor formation 211, 212, and 213 are given in Table 2 below. A high frequency power having a frequency of 13.56 MHz and a power density of 5 mW/cm$^3$ was introduced into the vacuum vessel for semiconductor formation 211 using the high frequency input unit 241 formed of an aluminum electrode. High frequency waves of 100 MHz were introduced into the vacuum vessel for semiconductor formation 212 using the high frequency input unit 242 formed of an aluminum electrode, while adjusting the power density to 100 mW/cm$^3$. A high frequency power having a frequency of 13.56 MHz and a power density of 30 mW/cm$^3$ was introduced into the vacuum vessel for semiconductor formation 213 using the high frequency input unit 243 formed of an aluminum electrode. The height adjustment mechanism in the vacuum vessel for semiconductor formation 212 achieved the distance of 9 mm between the electrically conductive substrate and the high frequency input unit.

The photovoltaic devices having one of the film thicknesses that are given in Table 3 were formed by using the deposition region adjustment plate in the vacuum vessel for semiconductor formation 212. Subsequently, a continuous modularization system (not shown) was used to form the resulting strips of photovoltaic device into solar cell modules of 36 cm by 22 cm (Examples 2-1, 2-2, 2-3, 2-4, and 2-5).

Then, the Examples 2-1 to 2-5 were repeated to form silicon-based thin films except that the temperature of the substrate was set to 300° C. on both the deposition sides and the backside, from which solar cell modules were obtained (Comparative Examples 2-1, 2-2, 2-3, 2-4, and 2-5).

Efficiencies of photoelectric conversion of the resulting solar cell modules were measured by using a solar simulator (AM 1.5, 100 mW/cm$^2$). In addition, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of –20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results of the temperature and humidity tests were given in Table 4 below.

The solar cells of the Examples 2-1 to 2-5 had a high fill factor. The fill factor was hardly varied for a larger film thickness. Any deterioration of the efficiency of photoelectric conversion was not observed in a temperature/humidity environment.

The above result indicates that the solar cells including the semiconductor device of the present invention have good properties.

Example 3

A photovoltaic device shown in FIG. 4 was produced in the following manner using the film deposition system 201 shown in FIG. 2A. FIG. 4 is a schematic cross-sectional view showing an example of a photovoltaic device including silicon-based thin films according to the present invention. In FIG. 4, similar members and components to those in FIG. 1 are depicted by like reference numerals and description thereof will be omitted. The semiconductor layer of this photovoltaic device comprises an amorphous n-type semiconductor layer 102-1A, a microcrystal i-type semiconductor layer 102-2A, and a microcrystal p-type semiconductor layer 102-3A. Thus, the illustrated photovoltaic device is a so-called pin-type single cell photovoltaic device.

Subsequently, high frequency waves were introduced into the high frequency input units 241 to 243 in the vacuum vessels for semiconductor formation 211 to 213 by the high frequency power sources 251 to 253, respectively. The glow discharge was produced in the deposition chamber within each of the vacuum vessels for semiconductor formation 211 to 213. Thus, an amorphous n-type semiconductor layer (30 nm thick), a microcrystal i-type semiconductor layer (2.0 μm thick), and a microcrystal p-type semiconductor layer (10 nm thick) were formed on the electrically conductive substrate 204 to produce a photovoltaic device. The formation of the microcrystal i-type semiconductor layer was performed while changing the power density.

The heater with cooling pipe 261 and the heater with cooling pipe 262 were controlled so that a predetermined temperature gradient is given between the deposition surface side of the substrate and the backside thereof through combined effects of the heaters and the cooling air flowing through the cooling pipes.

Deposition conditions for the vacuum vessels for semiconductor formation 211, 212, and 213 are given in Table 5 below. A high frequency power having a frequency of 13.56 MHz and a power density of 5 mW/cm$^3$ was introduced into the vacuum vessel for semiconductor formation 211 using the high frequency input unit 241 formed of an aluminum electrode. High frequency waves of 100 MHz were introduced into the vacuum vessel for semiconductor formation 212 using the high frequency input unit 242 formed of an aluminum electrode, while varying the power density as shown in Table 6 and changing the deposition rate. A high frequency power having a frequency of 13.56 MHz and a power density of 30 mW/cm$^3$ was introduced into the vacuum vessel for semiconductor formation 213 using the high frequency input unit 243 formed of an aluminum electrode. The height adjustment mechanism in the vacuum vessel for semiconductor formation 212 achieved the distance of 9 mm between the electrically conductive substrate and the high frequency input unit. In forming the i-type semiconductor layer, the film thickness was adjusted to 2.0 μm by using the deposition region adjustment plate. Subsequently, a continuous modularization system (not shown) was used to form the resulting strips of photovoltaic device into solar cell modules of 36 cm by 22 cm (Examples 3-1, 3-2, 3-3, 3-4, 3-5, 3-6, and 3-7).

Then, the Examples 3-1 to 3-7 were repeated to form solar cell modules except that the temperature of the substrate was set to 400° C. on both the deposition sides and the backside (Comparative Examples 3-1, 3-2, 3-3, 3-4, 3-5, 3-6, and 3-7).

Efficiencies of photoelectric conversion of the resulting solar cell modules were measured by using a solar simulator (AM 1.5, 100 mW/cm$^2$). In addition, adhesion between the electrically conductive substrate and the semiconductor layers was determined using the cross-hatch adhesion test (gap distance between cuts: 1 mm, number of squares: 100). Furthermore, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of –20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results of the temperature and humidity tests were given in Table 7 below.

The solar cell modules of the Examples 3-1 to 3-7 had a high initial efficiency of photoelectric conversion and exhibited good adhesion. Any deterioration of the efficiency of photoelectric conversion was not observed in a temperature/humidity environment. In particular, the solar cell modules of the Examples 3-1 to 3-7 were superior to those of the Comparative Examples in the adhesion properties in a region having a high power density.

The above result indicates that the solar cells including the semiconductor device of the present invention have good properties.

Example 4

Figure 5:
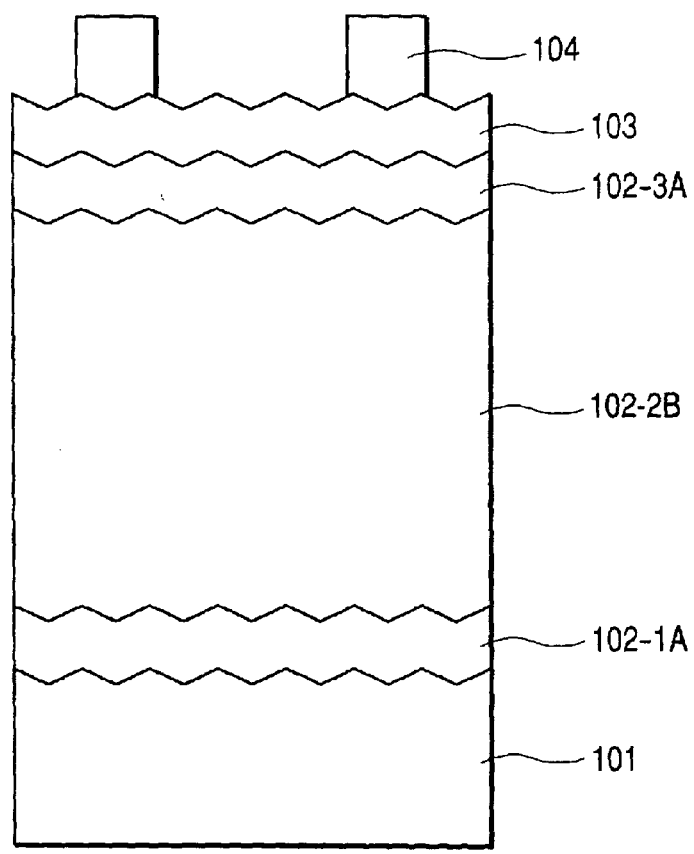
FIG. 5 is a schematic cross-sectional view showing an example of a photovoltaic device including a semiconductor device according to the present invention.

A photovoltaic device shown in FIG. 5 was produced in the following manner using the film deposition system 201 shown in FIG. 2A. FIG. 5 is a schematic cross-sectional view showing an example of a photovoltaic device including silicon-based thin films according to the present invention. In FIG. 5, similar members and components to those in FIG. 1 are depicted by like reference numerals and description thereof will be omitted. The semiconductor layer of this photovoltaic device comprises an amorphous n-type semiconductor layer 102-1A, an amorphous i-type semiconductor layer 102-2B, and a microcrystal p-type semiconductor layer 102-3A. Thus, the illustrated photovoltaic device is a so-called pin-type single cell photovoltaic device.

Subsequently, high frequency waves were introduced into the high frequency input units 241 to 243 in the vacuum vessels for semiconductor formation 211 to 213 by the high frequency power sources 251 to 253, respectively. The glow discharge was produced in the deposition chamber within each of the vacuum vessels for semiconductor formation 211 to 213. Thus, an amorphous n-type semiconductor layer (30 nm thick), an amorphous i-type semiconductor layer (300 nm), and a microcrystal p-type semiconductor layer (10 nm thick) were formed on the electrically conductive substrate 204 to produce a photovoltaic device.

The heater with cooling pipe 261 and the heater with cooling pipe 262 were controlled so that a predetermined temperature gradient is given between the deposition surface side of the substrate and the backside thereof through combined effects of the heaters and the cooling air flowing through the cooling pipes.

Deposition conditions for the vacuum vessels for semiconductor formation 211, 212, and 213 are given in Table 8 below. A high frequency power having a frequency of 13.56 MHz and a power density of 5 mW/cm$^3$ was introduced into the vacuum vessel for semiconductor formation 211 using the high frequency input unit 241 formed of an aluminum electrode. High frequency waves of 100 MHz, a high frequency power having a power density of 100 mW/cm$^3$, were introduced into the vacuum vessel for semiconductor formation 212 using the high frequency input unit 242 formed of an aluminum electrode. A high frequency power having a frequency of 13.56 MHz and a power density of 30 mW/cm$^3$ was introduced into the vacuum vessel for semiconductor formation 213 using the high frequency input unit 243 formed of an aluminum electrode. The height adjustment mechanism in the vacuum vessel for semiconductor formation 212 achieved the distance of 9 mm between the electrically conductive substrate and the high frequency input unit. Subsequently, a continuous modularization system (not shown) was used to form the resulting strips of photovoltaic device into solar cell modules of 36 cm by 22 cm. Ten similar solar cell modules were prepared from different locations of the electrically conductive substrates (Example 4).

Then, the Example 4 was repeated to form a solar cell module except that the temperature of the substrate was set to 250° C. on both the deposition sides and the backside (Comparative Example 4).

Efficiencies of photoelectric conversion of the resulting solar cell modules of the Examples and the Comparative Examples were measured by using a solar simulator (AM 1.5, 100 mW/cm$^2$). As a result, comparison of average efficiencies of photoelectric conversion between the solar cell modules of the Examples and the Comparative Examples indicated that the solar cell modules of the Examples had 1.15 times higher efficiency of photoelectric conversion. Variations of the efficiency of photoelectric conversion of the solar cell modules were determined, which indicated that the Example exhibited fewer variations.

The above result indicates that the solar cell including the semiconductor device of the present invention has good properties.

Example 5

Figure 8:
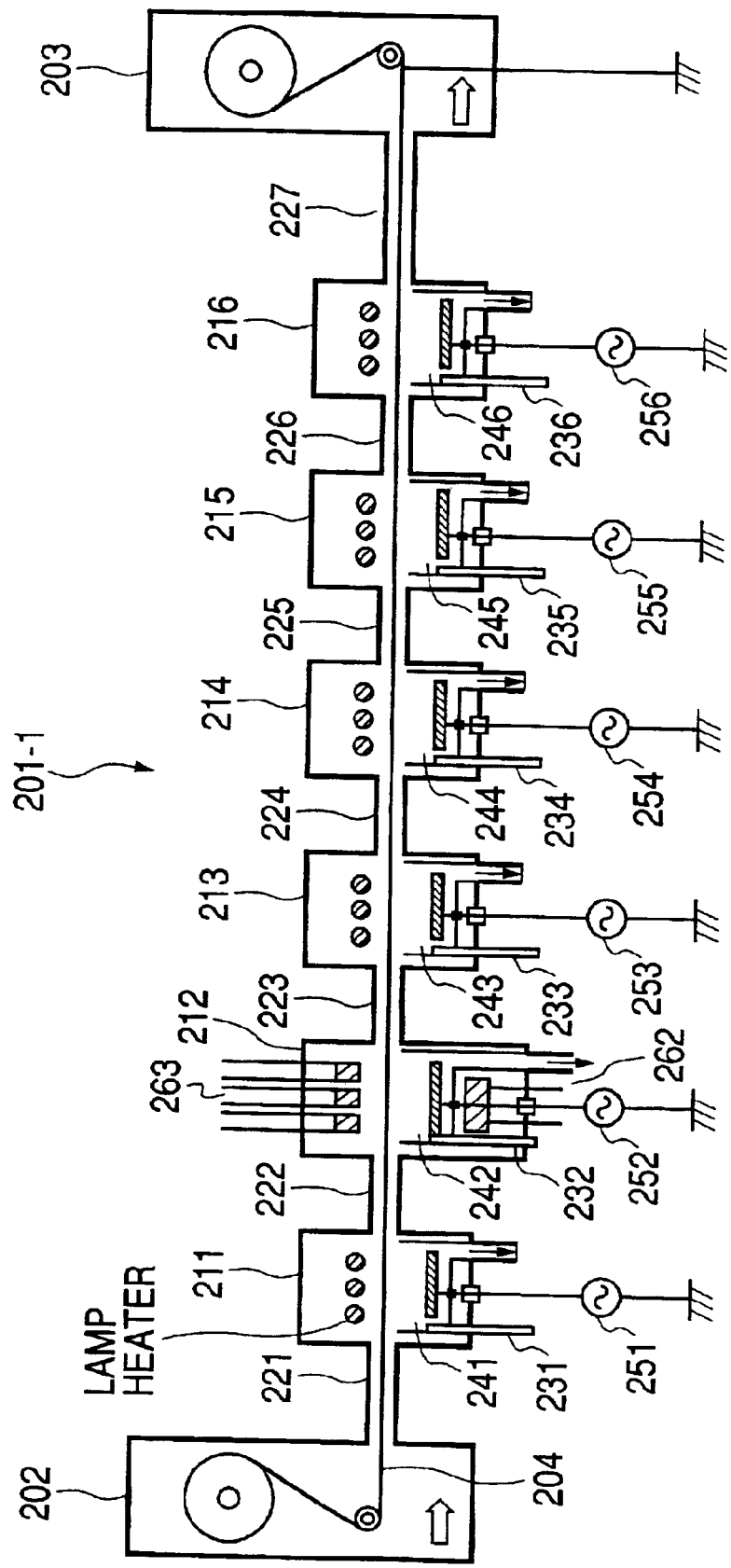
FIG. 8 is a schematic cross-sectional view showing an example of a film deposition system which is used to produce a semiconductor device and a photovoltaic device according to the present invention.

A film deposition system 201-1 shown in FIG. 8 was used to form a photovoltaic device shown in FIG. 4. In FIG. 8, similar members and components to those in FIG. 2a are depicted by like reference numerals and description thereof will be omitted.

The film deposition system shown in FIG. 8 is configured so that the temperature gradient of an electrically conductive substrate in the thickness direction thereof can be varied in forming silicon-based thin films when the electrically conductive substrate 204 is conveyed, by means of separating the heaters with cooling pipes in the vacuum vessel for semiconductor formation 212 and independently controlling them.

The Example 3-3 was repeated to form a solar cell module except that the temperature on the backside of the substrate was controlled to 400° C. at the beginning of the deposition and to 350° C. at the end of the deposition, while the temperature gradient was kept constant at 1,000° C./m, by means of adjusting the flow rate of the cooling gas flowing through the heater with cooling pipe in the plasma in the vacuum vessel for semiconductor formation 212 (Example 5).

An efficiency of photoelectric conversion of the resulting solar cell module was measured by using a solar simulator (AM 1.5, 100 mW/cm2). As a result, it was found that the solar cell module of the Example 5 has 1.1 times higher efficiency of photoelectric conversion than the solar cell of the Example 3-3.

The above result indicates that the solar cell including the semiconductor device of the present invention has good properties.

Example 6

A photovoltaic device shown in FIG. 4 was produced in the following manner using the film deposition system 201 shown in FIG. 2A.

The formation method was as follows. The Example 3-3 was repeated except that the SiF$_4$ gas mixed with oxygen as shown in Table 9 was used as the gas that was introduced into the vacuum vessel for semiconductor formation 213. Subsequently, a continuous modularization system (not shown) was used to form the resulting strips of photovoltaic device into solar cell modules of 36 cm by 22 cm (Examples 6-1, 6-2, 6-3, and 6-4).

Efficiencies of photoelectric conversion of the resulting solar cell modules were measured by using a solar simulator (AM 1.5, 100 mW/cm$^2$). In addition, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. Secondary Ion Mass Spectrometry (SIMS) measurement of the solar cell modules was carried out to evaluate oxygen concentration in the silicon-based thin film formed by using the vacuum vessel for semiconductor formation 213. The results are given in Table 10 below.

The above results indicate that the solar cells including the semiconductor device of the present invention have good properties. The films having a oxygen concentration of between $1.5 \times 10^{18}$ atoms/cm$^3$ and $5.0 \times 10^{19}$ atoms/cm$^3$, both inclusive, were particularly good.

Example 7

A photovoltaic device shown in FIG. 4 was produced in the following manner using the film deposition system 201 shown in FIG. 2A.

The formation method was as follows. The Example 3-3 was repeated except that the distance between the electrically conductive substrate and the high frequency input unit was varied as shown in Table 11 by using the height adjustment mechanism in the vacuum vessel for semiconductor formation 212. The resulting strips of photovoltaic device were formed into solar cell modules of 36 cm by 22 cm.

Efficiencies of photoelectric conversion of the resulting solar cell modules were measured by using a solar simulator (AM 1.5, 100 mW/cm$^2$). The results are given in Table 11. The i-type semiconductor layer with the distance of 2 mm had poor uniformity in film thickness and variations in efficiency of photoelectric conversion from module to module. The efficiency of photoelectric conversion was superior in the solar cell modules with the distance of equal to or larger than 3 mm but not larger than 30 mm between the electrically conductive substrate and the high frequency input unit.

The above results indicate that the solar cells including the semiconductor device of the present invention have good properties.

Example 8

A photovoltaic device shown in FIG. 4 was produced in the following manner using the film deposition system 201 shown in FIG. 2A.

The formation method was as follows. The Example 3-3 was repeated except that the pressure in the vacuum vessel for semiconductor formation 213 was varied as shown in Table 12. The resulting strips of photovoltaic device were formed into solar cell modules of 36 cm by 22 cm.

Efficiencies of photoelectric conversion of the resulting solar cell modules were measured by using a solar simulator (AM 1.5, 100 mW/cm$^2$). In addition, adhesion between the electrically conductive substrate and the semiconductor layers was determined using the cross-hatch adhesion test (gap distance between cuts: 1 mm, number of squares 100). Furthermore, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results were given in Table 12 below.

It is apparent from Table 12 that the solar cell modules which include a photovoltaic device produced at a pressure of equal to or higher than 90 Pa but not higher than 15,000 Pa in the vacuum vessel for semiconductor formation 213 were superior in efficiencies of photoelectric conversion as well as results of the cross-hatch adhesion test and the thermal and humidity test. In particular, the solar cell modules which include a photovoltaic device produced at a pressure of equal to or higher than 100 Pa but not higher than 5,000 Pa exhibited excellent properties in the cross-hatch adhesion test. The above results indicate that the solar cell modules including the semiconductor device of the present invention have good features.

Example 9

A photovoltaic device shown in FIG. 4 was produced in the following manner using the film deposition system 201 shown in FIG. 2A.

The formation method was as follows. The Example 3-3 was repeated except that the residence time in the vacuum vessel for semiconductor formation 212 was varied as shown in Table 13. The resulting strips of photovoltaic device were formed into solar cell modules of 36 cm by 22 cm.

It is apparent from Table 13 that the solar cell modules which include a photovoltaic device produced with the residence time in the semiconductor fabrication chamber 212 of equal to or longer than 0.01 seconds but not longer than 10 seconds were superior in efficiencies of photoelectric conversion, results of the cross-hatch adhesion test and the thermal and humidity test, and photodegradation rates. In particular, the solar cell modules which include a photovoltaic device produced with the residence time of equal to or longer than 0.1 seconds but not longer than 3 seconds exhibited excellent properties in the cross-hatch adhesion test. The above results indicate that the solar cell modules including the semiconductor device of the present invention have good features.

Example 10

Figure 7:
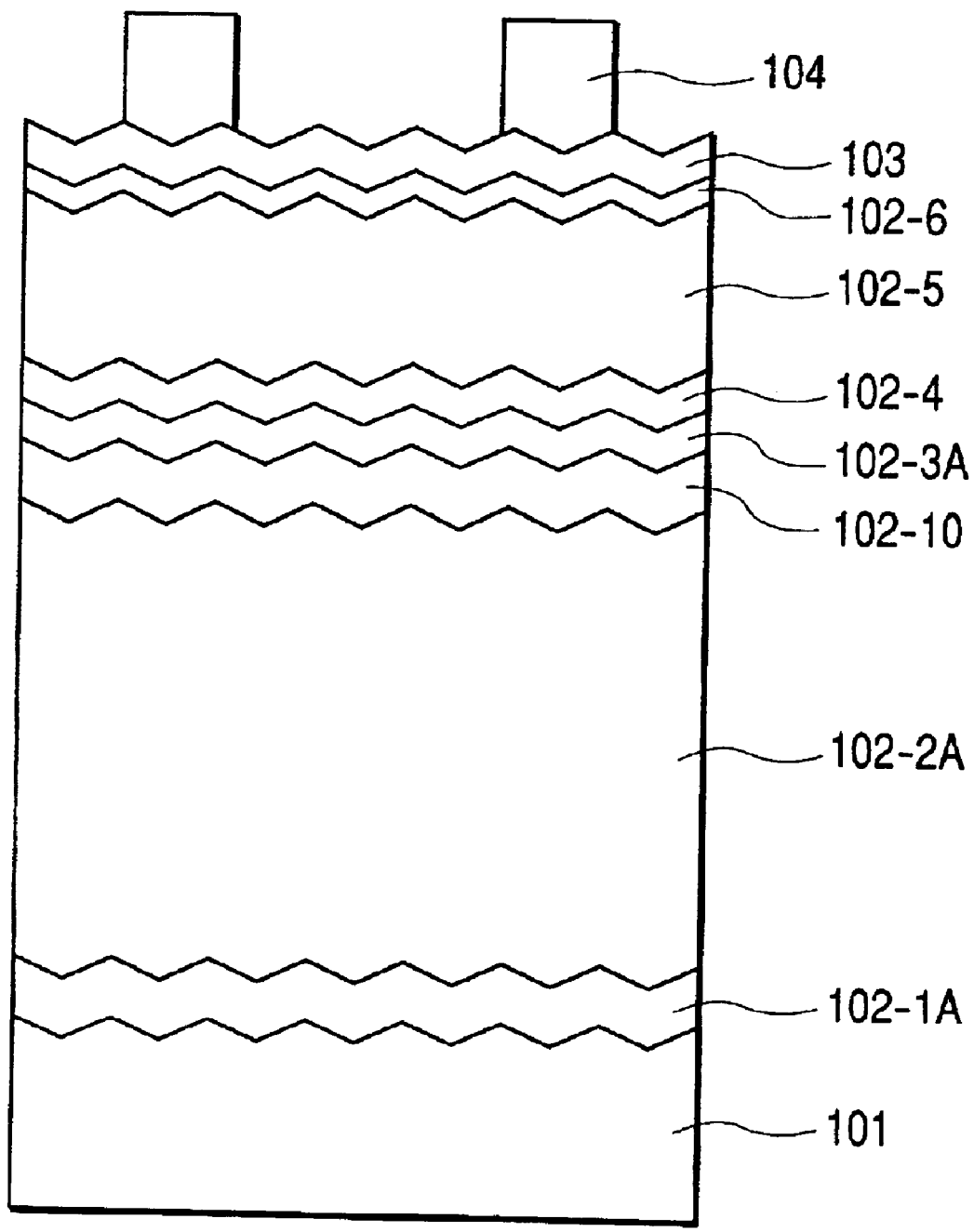
FIG. 7 is a schematic cross-sectional view showing an example of a photovoltaic device including a semiconductor device according to the present invention.

The film deposition system 201-1 shown in FIG. 8 was used to form a photovoltaic device shown in FIG. 7 in the manner described below. FIG. 7 is a schematic cross-sectional view showing an example of a photovoltaic device including silicon-based thin films according to the present invention. In FIG. 7, similar members and components to those in FIG. 1 are depicted by like reference numerals and description thereof will be omitted. The semiconductor layer of this photovoltaic device comprises amorphous n-type semiconductor layers 102-1A and 102-4, a microcrystal i-type semiconductor layer 102-2A, an amorphous i-type semiconductor layer 102-5, an amorphous silicon layer 102-10, and microcrystal p-type semiconductor layers 102-3A and 102-6. Thus, the illustrated photovoltaic device is a so-called pinpin-type double cell photovoltaic device.

As in the Example 1, the strip of electrically conductive substrate 204 was produced. The substrate was loaded onto the film deposition system 201. The substrate unwinding chamber 202, the vacuum vessels for semiconductor formation 211, 212, 213, 214, 215, and 216, and the substrate winding chamber 203 were evacuated thoroughly to a pressure not higher than $6.7 \times 10^{-4}$ Pa ($5 \times 10^{-6}$ Torr) by using a vacuum evacuation system formed of a vacuum pump which is not shown.

Next, the source gas and the dilution gas were supplied through the gas inlet pipes 231 to 236 to the vacuum vessels for semiconductor formation 211 to 216 while operating the vacuum evacuation system. The discharge chamber of the vacuum vessel for semiconductor formation 212 has a length of 1 m in the longitudinal direction and a width of 50 cm. The gas gates were supplied with the $H_2$ gas as a gate gas through respective gate gas supply pipes (not shown) at a flow rate of 500 sccm. At this point, the evacuation capacity of the vacuum evacuation system was controlled to adjust the pressure in the vacuum vessels for semiconductor formation 211 to 216 to a predetermined pressure. Deposition conditions for the vacuum vessels for semiconductor formation 211 to 213 are similar to those of the Example 3-3. Deposition conditions for the vacuum vessels for semiconductor formation 214 to 216 are as shown in Table 14 below.

In this event, the cooling pipe was supplied with the cooling air but the heater was not operated in the heater with cooling pipe 261. On the other hand, the cooling pipe was not supplied with the cooling air but the heater was operated in the heater with cooling pipe 262. Thus, a predetermined temperature gradient was achieved on the deposition side of the substrate and the backside thereof.

The strip of electrically conductive substrate 204 was initiated to travel from the substrate unwinding chamber 202 to the substrate winding chamber 203 when the pressures in the vacuum vessels for semiconductor formation 211 to 216 were stabilized.

Subsequently, high frequency waves were introduced into the high frequency input units 241 to 246 in the vacuum vessels for semiconductor formation 211 to 216 by the high frequency power sources 251 to 256, respectively. The glow discharge was produced in the deposition chamber within each of the vacuum vessels for semiconductor formation 211 to 216. Thus, an amorphous n-type semiconductor layer (30 nm thick), a microcrystal i-type semiconductor layer (2.0 μm thick), a microcrystal p-type semiconductor layer (10 nm thick), an amorphous n-type semiconductor layer (30 nm thick), an amorphous i-type semiconductor layer (300 nm thick), and a microcrystal p-type semiconductor layer (10 nm thick) were formed on the electrically conductive substrate 204 to produce a photovoltaic device. A high frequency power having a frequency of 13.56 MHz and a power density of 5 mW/cm$^3$ was introduced into the vacuum vessels for semiconductor formation 211 and 216 using the high frequency input units 241 and 246 each formed of an aluminum electrode. High frequency waves of 60 MHz were introduced into the vacuum vessel for semiconductor formation 212 using the high frequency input unit 242 formed of an aluminum electrode, while adjusting the power density to 400 mW/cm$^3$. High frequency waves of 60 MHz were introduced into the vacuum vessel for semiconductor formation 213 using the high frequency input unit 243 formed of an aluminum electrode, while adjusting the power density to 300 mW/cm$^3$. High frequency waves of 100 MHz were introduced into the vacuum vessels for semiconductor formation 214 and 217 using the high frequency input units 244 and 247 each formed of an aluminum electrode, while adjusting the power density to 100 mW/cm$^3$. A high frequency power having a frequency of 13.56 MHz and a power density of 30 mW/cm$^3$ was introduced into the vacuum vessels for semiconductor formation 215 and 218 using the high frequency input units 245 and 248 formed of an aluminum electrode. Subsequently, a continuous modularization system (not shown) was used to form the resulting strips of photovoltaic device into solar cell modules of 36 cm by 22 cm.

Efficiencies of photoelectric conversion of the resulting solar cell modules were measured by using a solar simulator (AM 1.5, 100 mW/cm$^2$). As a result, it was found that the solar cell modules of this example have 1.2 times higher efficiency of photoelectric conversion than the single solar cell module of the Example 3-3. The modules exhibited good results in the cross-hatch adhesion test and the temperature and humidity test. The above results indicate that the solar cell modules including the semiconductor device of the present invention have good features.

Example 11

A photovoltaic device shown in FIG. 4 was produced in the following manner using the film deposition system 201 shown in FIG. 2A.

The formation method was as follows. The temperature gradient in forming the microcrystal i-type semiconductor layer was changed as shown in Table 15. In the vacuum vessel for semiconductor formation 212, an aluminum heat reflecting hood 272, a discharge plate 274 and a domed heat reflector 273 were provided on the backside of the electrically conductive substrate 204 in addition to the heater 271 with cooling pipe shown in FIG. 10. The remainders were similar to those in the Example 3-3. The resulting strips of photovoltaic device were formed into solar cell modules of 36 cm by 22 cm.

It is apparent from Table 15 that the solar cell modules which include a photovoltaic device produced with the temperature gradient in a range between 500° C./m and 100,000° C./m, both inclusive, were superior in efficiencies of photoelectric conversion, results of the cross-hatch adhesion test and the thermal and humidity test, and photodegradation rates. The above results indicate that the solar cell modules including the semiconductor device of the present invention have good features.

Example 12

Figure 9:
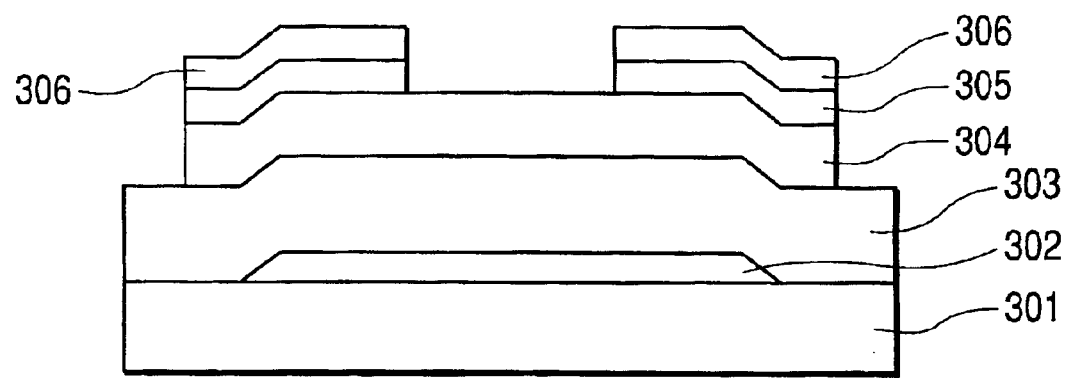
FIG. 9 is a schematic cross-sectional view showing an example of a TFT including a semiconductor device according to the present invention.

An inverted-stagger type TFT was produced in the manner described below. FIG. 9 is a schematic cross-sectional view showing an example of an inverted-stagger type TFT including a semiconductor device according to the present invention. A glass substrate 301 was used as an insulated substrate. On the substrate, a gate electrode 302 was formed. Moreover, it is configured with a gate insulation film 303, an active layer 304 formed of an undoped silicon layer, a source on the active layer 304, an Ohmic contact layer 305 formed of an n$^+$ type amorphous silicon having a low resistivity on a drain region, and source and drain electrodes 306.

An Mo—Ta alloy film layer was formed on the glass substrate 301 by the sputtering technique. The gate electrode 302 was formed by means of patterning. Next, the gate insulation film 303 of silicon oxide film was formed by using the CVD technique. Thereafter, the glass substrate was loaded onto the vacuum vessel for semiconductor formation 212 shown in FIG. 2A to form the active layer 304 of 80 nm under the conditions given in the Example 1-1. The glass substrate was then loaded onto the vacuum vessel for semiconductor formation 211 to deposit the Ohmic contact layer 305 formed of the n$^+$ type amorphous silicon. Patterning was made through lithography processes. Furthermore, a metal film was formed and patterned to produce the source and drain electrodes 306. Finally, a mixed gas of $CF_4$ and $O_2$ was used to etch the Ohmic contact layer 305 exposed between the source and drain electrodes 306 to obtain a TFT (Example 12).

The Example 12 was repeated to obtain a TFT except that the active layer 304 of 80 nm was formed under the conditions given in the Comparative Example 1-1 (Comparative Example 12).

When the Ohmic contact layer 305 was subjected to the etching, no excessive etching was observed in the active layer 304 of the TFT obtained in the Example 12. On the contrary, a slight excessive etching was observed in the TFT obtained in the Comparative Example 12. The active layer was reduced in thickness and the uniformity of the film thickness was deteriorated accordingly. In addition, etching damages caused a partial leak path to be formed in the active layer. This increased the value of off-current as compared with the Example 12.

The above results indicate that the TFT including the semiconductor device of the present invention has good features.

Example 13

A photovoltaic device shown in FIG. 4 was produced in the following manner using a film deposition system 201a shown in FIG. 2B (which is different in shape of the heaters 261 and 262). In FIG. 2b, similar members and components to those in FIG. 2a are depicted by like reference numerals and description thereof will be omitted.

The Example 1 was repeated to obtain silicon-based thin films (Example 13-1 and Comparative Example 13-1) and solar cell modules (Example 13-2 and Comparative Example 13-2) except that conditions to deposit the semiconductor layers were changed as shown in Table 16. The heater with cooling pipe 261 and the heater with cooling pipe 262 were controlled so that a temperature gradient is given between the deposition surface side of the substrate and the backside thereof through combined effects of the heaters and the cooling air flowing through the cooling pipes, in which the temperature gradient was continuously changed and reversed from 1,000° C./m (temperature on the side of the deposition surface>temperature on the backside) at the beginning of the deposition to 1,000° C./m (temperature on the side of the deposition surface<temperature on the backside) at the end of the deposition.

Diffraction peaks of the resulting silicon-based thin films were measured using an x-ray diffractometer. Though the silicon-based thin films of the Example 13-1 and the Comparative Example 13-1 were predominantly oriented to the (220) plane, it was found that the silicon-based thin film of the Example 13-1 exhibited higher diffraction peak intensity of the (220) plane relative to the total diffraction intensity obtained for the eleven reflections from a small angle side and also exhibited smaller half bandwidth of the diffraction peak. The thin film of the Example 13-1 was found to be superior in the orientation of the (220) plane and crystallization properties and to have a larger grain diameter. In addition, adhesion between the electrically conductive substrate and the semiconductor layers was determined using the cross-hatch adhesion test (gas distance between cuts: 1 mm, number of squares: 100). As a result, it was found that the silicon-based thin film of the Example 13-1 exhibited better adhesion to the substrate.

Efficiencies of photoelectric conversion of the resulting solar cell modules were measured by using a solar simulator (AM 1.5, 100 mW/cm²). As a result, it was found that the solar cell module of the Example 13-2 has 1.15 times higher efficiency of photoelectric conversion than the solar cell of the Comparative Example 13-2.

The above result indicates that the solar cell including the semiconductor device of the present invention has good properties.

Example 14

The Example 2 was repeated using the film deposition system 201a shown in FIG. 2B to obtain solar cell modules having one of the film thicknesses that are given in Table 3 except that deposition conditions were changed as shown in Table 17.

Efficiencies of photoelectric conversion of the resulting solar cell modules were measured by using a solar simulator (AM 1.5, 100 mW/cm²). In addition, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results of the temperature and humidity tests were given in Table 18 below.

The solar cell modules of the Examples 14-1 to 14-5 had a high fill factor. The fill factor was hardly varied for a larger film thickness. Any deterioration of the efficiency of photoelectric conversion was not observed in a temperature/humidity environment.

The above result indicates that the solar cells including the semiconductor device of the present invention have good properties.

Example 15

The Example 3 was repeated using the film deposition system 201a shown in FIG. 2B to obtain solar cell modules for the power densities that are given in Table 6 except that deposition conditions were changed as shown in Table 19.

Efficiencies of photoelectric conversion of the resulting solar cell modules were measured by using a solar simulator (AM 1.5, 100 mW/cm²). In addition, adhesion between the electrically conductive substrate and the semiconductor layers was determined using the cross-hatch adhesion test (cross-scoring with 9 horizontal and 9 vertical lines, 1 mm apart). Furthermore, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results were given in Table 20 below.

The solar cell modules of the Examples 15-1 to 15-7 had a high initial efficiency of photoelectric conversion and exhibited good adhesion. Any deterioration of the efficiency of photoelectric conversion was not observed in a temperature/humidity environment. In particular, the solar cell modules of the Examples 15-1 to 15-7 were superior to those of the Comparative Examples in the adhesion properties in a region having a high power density.

The above result indicates that the solar cells including the semiconductor device of the present invention have good properties.

Example 16

The Example 4 was repeated using the film deposition system 201a shown in FIG. 2B to obtain solar cell modules except that deposition conditions were changed as shown in Table 21 (Example 16 and Comparative Example 16).

Efficiencies of photoelectric conversion of the resulting solar cell modules of the Example 16 and the Comparative Example 16 were measured by using a solar simulator (AM 1.5, 100 mW/cm$^2$). As a result, comparison of average efficiencies of photoelectric conversion between the solar cell modules of the Example and the Comparative Example indicated that the solar cell module of the Example had 1.15 times higher efficiency of photoelectric conversion. Variations of the efficiency of photoelectric conversion of the solar cell modules were determined, which indicated that the Example exhibited less variations.

The above result indicates that the solar cell including the semiconductor device of the present invention has good properties.

Example 17

The Example 15-3 was repeated to form a solar cell module except that the temperature on the backside of the substrate was controlled to 400° C. at the beginning of the deposition and to 350° C. at the end of the deposition by means of adjusting the flow rate of the cooling gas flowing through the heater with cooling pipe in the plasma in the vacuum vessel for semiconductor formation 212 (Example 17).

An efficiency of photoelectric conversion of the resulting solar cell module was measured by using a solar simulator (AM 1.5, 100 mW/cm$^2$). As a result, it was found that the solar cell module of the Example 17 has 1.1 times higher efficiency of photoelectric conversion than the solar cell of the Example 15-3.

The above result indicates that the solar cell including the semiconductor device of the present invention has good properties.

Example 18

The Example 15-3 was repeated except that the SiF$_4$ gas mixed with oxygen as shown in Table 9 was used as the gas that was introduced into the vacuum vessel for semiconductor formation 213 to produce solar cell modules (Examples 18-1, 18-2, 18-3, and 18-4).

Efficiencies of photoelectric conversion of the resulting solar cell modules were measured by using a solar simulator (AM 1.5, 100 mW/cm$^2$). In addition, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. Secondary Ion Mass Spectrometry (SIMS) measurement of the solar cell modules was carried out to evaluate oxygen concentration in the silicon-based thin film formed by using the vacuum vessel for semiconductor formation 213. The results are given in Table 22 below.

The above results indicate that the solar cells including the semiconductor device of the present invention have good properties. The films having a oxygen concentration of between 1.5×10$^{18}$ atoms/cm$^3$ and 5.0×10$^{19}$ atoms/cm$^3$, both inclusive, were particularly good.

Example 19

The Example 15-3 was repeated except that the distance between the electrically conductive substrate and the high frequency input unit was varied as shown in Table 23 by using the height adjustment mechanism in the vacuum vessel for semiconductor formation 212 to produce solar cell modules.

Efficiencies of photoelectric conversion of the resulting solar cell modules were measured by using a solar simulator (AM 1.5, 100 mW/cm$^2$). The results are given in Table 23. The i-type semiconductor layer with the distance of 2 mm had poor uniformity in film thickness and variations in efficiency of photoelectric conversion from module to module. The efficiency of photoelectric conversion was superior in the solar cell modules with the distance of equal to or larger than 3 mm but not larger than 30 mm between the electrically conductive substrate and the high frequency input unit.

The above results indicate that the solar cells including the semiconductor device of the present invention have good properties.

Example 20

The Example 15-3 was repeated except that the pressure in the vacuum vessel for semiconductor formation 213 was varied as shown in Table 24 to produce solar cell modules.

Efficiencies of photoelectric conversion of the resulting solar cell modules were measured by using a solar simulator (AM 1.5, 100 mW/cm$^2$). In addition, adhesion between the electrically conductive substrate and the semiconductor layers was determined using the cross-hatch adhesion test (gas distance between cuts: 1 mm, number of squares: 100). Furthermore, the following cycle was repeated 100 times: a solar cell module of which initial efficiency of photoelectric conversion had been measured beforehand was placed in a dark place having a temperature of 85° C. and a humidity of 85%; kept at that point for 30 minutes; cooled to a temperature of −20° C. over 70 minutes; kept at that point for 30 minutes; and returned over an additional 70 minutes to the condition of the temperature of 85° C. and the humidity of 85%. After the cycles, the efficiency of photoelectric conversion was measured again to examine variations of the efficiency of photoelectric conversion by using temperature and humidity tests. The values of the fill factor for the initial efficiency of photoelectric conversion and the results were given in Table 24 below.

It is apparent from Table 24 that the solar cell modules which include a photovoltaic device produced at a pressure of equal to or higher than 90 Pa but not higher than 15,000 Pa in the vacuum vessel for semiconductor formation 213 were superior in efficiencies of photoelectric conversion as well as results of the cross-hatch adhesion test and the thermal and humidity test. In particular, the solar cell modules which include a photovoltaic device produced at a pressure of equal to or higher than 100 Pa but not higher than 5,000 Pa exhibited excellent properties in the cross-hatch adhesion test. The above results indicate that the solar cell modules including the semiconductor device of the present invention have good features.

Example 21

The Example 15-3 was repeated except that the residence time in the vacuum vessel for semiconductor formation 212 was varied as shown in Table 25 to produce solar cell modules.

It is apparent from Table 25 that the solar cell modules which include a photovoltaic device produced with the residence time in the semiconductor fabrication chamber 212 of equal to or longer than 0.01 seconds but not longer than 10 seconds were superior in efficiencies of photoelectric conversion, results of the cross-hatch adhesion test and the thermal and humidity test, and photodegradation rates. In particular, the solar cell modules which include a photovoltaic device produced with the residence time of equal to or longer than 0.1 seconds but not longer than 3 seconds exhibited excellent properties in the cross-hatch adhesion test. The above results indicate that the solar cell modules including the semiconductor device of the present invention have good features.

Example 22

The film deposition system 201a shown in FIG. 2B was used to form a photovoltaic device shown in FIG. 7. Deposition conditions for the vacuum vessels for semiconductor formation 211 to 213 are similar to those of the Example 15-3. Deposition conditions for the vacuum vessels for semiconductor formation 214 to 216 are as shown in Table 26 below. Other conditions were similar to those in the Example 10 to obtain solar cell modules.

Efficiencies of photoelectric conversion of the resulting solar cell modules were measured by using a solar simulator (AM 1.5, 100 mW/cm$^2$). As a result, it was found that the solar cell modules of this example have 1.23 times higher efficiency of photoelectric conversion than the single solar cell module of the Example 15-3. The modules exhibited good results in the cross-hatch adhesion test and the temperature and humidity test. The above results indicate that the solar cell modules including the semiconductor device of the present invention have good features.

Example 23

A photovoltaic device shown in FIG. 4 was produced in the following manner using the film deposition system 201-1 shown in FIG. 8.

The formation method was as follows. The temperature gradient at the end of the deposition in forming the microcrystal i-type semiconductor layer was changed as shown in Table 27. In the vacuum vessel for semiconductor formation 212, an aluminum heat reflecting hood and a domed heat reflector were provided on the backside of the electrically conductive substrate 204 in addition to the heater with cooling pipe shown in FIG. 10. The remainders were similar to those in the Example 15-3. The resulting strips of photovoltaic device were formed into solar cell modules of 36 cm by 22 cm.

It is apparent from Table 27 that the solar cell modules which include a photovoltaic device produced with the temperature gradient at the end of the deposition being in a range between 500° C./m and 100,000° C./m, both inclusive, were superior in efficiencies of photoelectric conversion, results of the cross-hatch adhesion test and the thermal and humidity test, and photodegradation rates. The above results indicate that the solar cell modules including the semiconductor device of the present invention have good features.

Example 24

An inverted-stagger type TFT shown in FIG. 9 was produced in the manner described below.

An Mo—Ta alloy film layer was formed on the glass substrate 301 by the sputtering technique. The gate electrode 302 was formed by means of patterning. Next, the gate insulation film 303 of silicon oxide film was formed by using the CVD technique. Thereafter, the glass substrate was loaded onto the vacuum vessel for semiconductor formation 212 shown in FIG. 2 to form the active layer 304 of 80 nm under the conditions given in the Example 13-1. The glass substrate was then loaded onto the vacuum vessel for semiconductor formation 211 to deposit the Ohmic contact layer 305 formed of the n$^+$ type amorphous silicon. Patterning was made through lithography processes. Furthermore, a metal film was formed and patterned to produce the source and drain electrodes 306. Finally, a mixed gas of $CF_4$ and $O_2$ was used to etch the Ohmic contact layer 305 exposed between the source and drain electrodes 306 to obtain a TFT

Example 24

The Example 24 was repeated to obtain a TFT except that the active layer 304 of 80 nm was formed under the conditions given in the Comparative Example 13-1 (Comparative Example 24).

When the Ohmic contact layer 305 was subjected to the etching, no excessive etching was observed in the active layer 304 of the TFT obtained in the Example 24. On the contrary, a slight excessive etching was observed in the TFT obtained in the Comparative Example 24. The active layer was reduced in thickness and the uniformity of the film thickness was deteriorated accordingly. In addition, etching damages caused a partial leak path to be formed in the active layer. This increased the value of off-current as compared with the Example 24.

The above results indicate that the TFT including the semiconductor device of the present invention has good features.

According to the preferred examples of the present invention, it was found that the silicon-based thin films with low defect density can be formed using high rate deposition; that good electrical properties can be achieved in a semiconductor device in which at least one constituting silicon-based thin film of the semiconductor device is formed according to the above-mentioned procedure; and that it is possible to produce, at low costs, a semiconductor device having excellent adhesion and weather-resisting properties.

TABLE 1

| | | |
|---|---|---|
| Deposition conditions for 211 | Source gas | $SiH_4$:20 cm$^3$/min (normal) $H_2$:100 cm$^3$/min (normal) $PH_3$ (Diluted to 2% with $H_2$): 30 cm$^3$/min (normal) |
| | Substrate temperature | 300° C. |
| | Pressure | 133 Pa (1.0 Torr) |
| Deposition conditions for 212 | Source gas | $SiH_4$:$SiF_4$:H2 = 1:6:20 τ = 0.4 sec. |
| | Substrate backside temperature | 350° C. |
| | Temperature gradient | 1,000° C./m |
| | Pressure | 200 Pa (1.5 Torr) |
| Deposition conditions for 213 | Source gas | $SiH_4$:10 cm$^3$/min (normal) $H_2$:800 cm$^3$/min (normal) $BF_3$ (Diluted to 2% with $H_2$): 100 cm$^3$/min (normal) |
| | Substrate temperature | 200° C. |
| | Pressure | 160 Pa (1.2 Torr) |

TABLE 2

| Deposition conditions for 211 | Source gas | SiH$_4$:20 cm$^3$/min (normal) |
| --- | --- | --- |
| | | H$_2$:100 cm$^3$/min (normal) |
| | | PH$_3$ (Diluted to 2% with H$_2$): 30 cm$^3$/min (normal) |
| | Substrate temperature | 300° C. |
| | Pressure | 133 Pa (1.0 Torr) |
| Deposition conditions for 212 | Source gas | SiF$_4$:H$_2$ = 1:3 |
| | | τ = 0.5 sec. |
| | Substrate backside temperature | 300° C. |
| | Temperature gradient | 2,000° C./m |
| | Pressure | 200 Pa (1.5 Torr) |
| Deposition conditions for 213 | Source gas | SiH$_4$:10 cm$^3$/min (normal) |
| | | H$_2$:800 cm$^3$/min (normal) |
| | | BF$_3$ (Diluted to 2% with H$_2$): 100 cm$^3$/min (normal) |
| | Substrate temperature | 200° C. |
| | Pressure | 160 Pa (1.2 Torr) |

TABLE 3

| | Film thickness (μm) |
| --- | --- |
| Examples 2-1, 14-1 Comparative examples 2-1, 14-1 | 0.5 |
| Examples 2-2, 14-2 Comparative examples 2-2, 14-2 | 1.0 |
| Examples 2-3, 14-3 Comparative examples 2-3, 14-3 | 2.0 |
| Examples 2-4, 14-4 Comparative examples 2-4, 14-4 | 3.0 |
| Examples 2-5, 14-5 Comparative examples 2-5, 14-5 | 5.0 |

TABLE 4

| | Fill factor | Change in photoelectric conversion efficiencies (Post-test efficiency/initial efficiency) |
| --- | --- | --- |
| Example 2-1 | 1 | 1.0 |
| Example 2-2 | 1.01 | 1.0 |
| Example 2-3 | 0.99 | 1.0 |
| Example 2-4 | 0.98 | 1.0 |
| Example 2-5 | 0.98 | 1.0 |
| Comparative example 2-1 | 0.95 | 0.98 |
| Comparative example 2-2 | 0.92 | 0.98 |
| Comparative example 2-3 | 0.90 | 0.97 |
| Comparative example 2-4 | 0.87 | 0.95 |
| Comparative example 2-5 | 0.52 | 0.93 |

TABLE 5

| Deposition conditions for 211 | Source gas | SiH$_4$:20 cm$^3$/min (normal) |
| --- | --- | --- |
| | | H$_2$:100 cm$^3$/min (normal) |
| | | PH$_3$ (Diluted to 2% with H$_2$): 30 cm$^3$/min (normal) |
| | Substrate temperature | 300° C. |
| | Pressure | 133 Pa (1.0 Torr) |
| Deposition conditions for 212 | Source gas | SiH$_4$:SiF$_4$:H$_2$ = 1:1:3 |
| | | τ = 0.7 sec. |
| | Substrate backside temperature | 400° C. |
| | Temperature gradient | 1,000° C./m |
| | Pressure | 200 Pa (1.5 Torr) |
| Deposition conditions for 213 | Source gas | SiH$_4$:10 cm$^3$/min (normal) |
| | | H$_2$:800 cm$^3$/min (normal) |
| | | BF$_3$ (Diluted to 2% with H$_2$): 100 cm$^3$/min (normal) |
| | Substrate temperature | 200° C. |
| | Pressure | 160 Pa (1.2 Torr) |

TABLE 6

| | Power density (W/cm$^3$) |
| --- | --- |
| Examples 3-1, 15-1 Comparative examples 3-1, 15-1 | 0.05 |
| Examples 3-2, 15-2 Comparative examples 3-2, 15-2 | 0.01 |
| Examples 3-3, 15-3 Comparative examples 3-3, 15-3 | 0.1 |
| Examples 3-4, 15-4 Comparative examples 3-4, 15-4 | 0.5 |
| Examples 3-5, 15-5 Comparative examples 3-5, 15-5 | 1.0 |
| Examples 3-6, 15-6 Comparative examples 3-6, 15-6 | 2.0 |
| Examples 3-7, 15-7 Comparative examples 3-7, 15-7 | 5.0 |

TABLE 7

| | Initial photoelectric conversion efficiencies | Cross-hatch adhesion test | Change in photoelectric conversion efficiencies (Post-test efficiency/initial efficiency |
| --- | --- | --- | --- |
| Example 3-1 | 1 | A | 1.0 |
| Example 3-2 | 1.05 | A | 1.0 |
| Example 3-3 | 1.07 | AA | 1.0 |
| Example 3-4 | 1.10 | AA | 1.0 |
| Example 3-5 | 1.10 | AA | 1.0 |
| Example 3-6 | 1.05 | A | 1.0 |
| Example 3-7 | 0.98 | A | 1.0 |
| Comparative example 3-1 | 0.94 | A | 1.0 |
| Comparative example 3-2 | 0.95 | A | 1.0 |
| Comparative example 3-3 | 0.95 | A | 0.98 |
| Comparative example 3-4 | 0.92 | A | 0.98 |
| Comparative example 3-5 | 0.90 | B | 0.95 |
| Comparative example 3-6 | 0.85 | B | 0.95 |
| Comparative example 3-7 | 0.79 | B | 0.93 |

The initial efficiencies of the photoelectric conversion are obtained by standardizing the measured values with respect to the value in Example 3-1.

The rating in the cross-hatch adhesion test is given as a symbol grade representing the number of squares removed: AA (0), A (1-2), B (3-10), or C (10-100).

TABLE 8

| Deposition conditions for 211 | Source gas | SiH$_4$:20 cm$^3$/min (normal) |
| --- | --- | --- |
| | | H$_2$:100 cm$^3$/min (normal) |
| | | PH$_3$ (Diluted to 2% with H$_2$): 30 cm$^3$/min (normal) |

TABLE 8-continued

| | | |
|---|---|---|
| Deposition conditions for 212 | Substrate temperature | 300° C. |
| | Pressure | 133 Pa (1.0 Torr) |
| | Source gas | $SiH_4:H_2 = 1:12$ |
| | | $\tau = 0.4$ sec. |
| | Substrate backside temperature | 250° C. |
| | Temperature gradient | 500° C./m |
| | Pressure | 1500 Pa (11.3 Torr) |
| Deposition conditions for 213 | Source gas | $SiH_4$:10 cm³/min (normal) |
| | | $H_2$:800 cm³/min (normal) |
| | | $BF_3$ (Diluted to 2% with $H_2$): 100 cm³/min (normal) |
| | Substrate temperature | 200° C. |
| | Pressure | 160 Pa (1.2 Torr) |

TABLE 9

| | |
|---|---|
| $SiF_4$ gas (Examples 6-1, 18-1) | $SiF_4$/oxygen (0.1 ppm) mixture |
| $SiF_4$ gas (Examples 6-2, 18-2) | $SiF_4$/oxygen (0.3 ppm) mixture |
| $SiF_4$ gas (Examples 6-3, 18-3) | $SiF_4$/oxygen (0.7 ppm) mixture |
| $SiF_4$ gas (Examples 6-4, 18-4) | $SiF_4$/oxygen (1.0 ppm) mixture |

TABLE 10

| | Example 3-3 | Example 6-1 | Example 6-2 | Example 6-3 | Example 6-4 |
|---|---|---|---|---|---|
| Oxygen concentration in thin film (atoms/cm³) | $1.0 \times 10^{18}$ | $1.5 \times 10^{18}$ | $7.0 \times 10^{18}$ | $5.0 \times 10^{19}$ | $7.0 \times 10^{19}$ |
| Initial photoelectric conversion efficiencies | 1 | 1.10 | 1.12 | 1.14 | 1.03 |
| Change in photoelectric conversion efficiencies (Post-test efficiency/initial efficiency) | 0.98 | 1.0 | 1.0 | 1.0 | 0.95 |

TABLE 11

| | | | | | | | |
|---|---|---|---|---|---|---|---|
| Distance between electrically conductive substrate and high frequency input unit (mm) | 2 | 3 | 6 | 9 | 15 | 30 | 50 |
| Photoelectric conversion efficiencies | — | 1 | 1.01 | 1.02 | 1.10 | 1.10 | 0.7 |

The results are obtained by standardizing the measured values with respect to the distance (3 mm) between the electrically conductive substrate and the high frequency input unit.

TABLE 12

| | | | | | | | | |
|---|---|---|---|---|---|---|---|---|
| Pressure in semiconductor fabrication Chamber 213 (Pa) | 50 | 90 | 100 | 1000 | 5000 | 10000 | 15000 | 20000 |
| Photoelectric conversion efficiencies | 1 | 1.20 | 1.35 | 1.40 | 1.40 | 1.35 | 1.30 | 0.9 |
| Cross-hatch adhesion test | C | A | AA | AA | AA | A | A | B |
| Thermal & humidity test | 0.70 | 0.90 | 1.0 | 1.0 | 1.0 | 0.95 | 0.9 | 0.75 |

The efficiencies of the photoelectric conversion are obtained by standardizing the measured values with respect to the pressure (50 Pa) within the semiconductor fabrication chamber 213.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

TABLE 13

| | | | | | | | |
|---|---|---|---|---|---|---|---|
| Residence time (sec.) in semiconductor fabrication chambers 212 & 213 | 0.008 | 0.01 | 0.1 | 1.0 | 3.0 | 10 | 15 |
| Photoelectric conversion efficiencies | 1 | 1.40 | 1.45 | 1.50 | 1.45 | 1.42 | 0.80 |
| Cross-hatch adhesion test | B | A | AA | AA | AA | A | C |
| Thermal & humidity test | 0.7 | 0.9 | 1.0 | 1.0 | 1.0 | 1.0 | 0.7 |

The efficiencies of the photoelectric conversion are obtained by standardizing the measured values with respect to the residence time (0.008 sec.) in the semiconductor fabrication chambers 212 and 213.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

TABLE 14

| | | |
|---|---|---|
| Deposition conditions for 216 | Source gas | SiH$_4$:20 cm$^3$/min (normal)<br>H$_2$:100 cm$^3$/min (normal)<br>PH$_3$ (Diluted to 2% with H$_2$): 50 cm$^3$/min (normal) |
| | Substrate temperature | 300° C. |
| | Pressure | 133 Pa (1.0 Torr) |
| Deposition conditions for 217 | Source gas | SiH$_4$:300 cm$^3$/min (normal)<br>H$_2$:4000 cm$^3$/min (normal) |
| | Substrate temperature | 300° C. |
| | Pressure | 1500 Pa (11.3 Torr) |
| Deposition conditions for 218 | Source gas | SiH$_4$:10 cm$^3$/min (normal)<br>H$_2$:800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 15

| Temperature gradient (° C./m) | 0 | 100 | 500 | 1000 | 10000 | 100000 | 500000 |
|---|---|---|---|---|---|---|---|
| Photoelectric conversion efficiencies | 1 | 1.00 | 1.10 | 1.13 | 1.14 | 1.13 | 1.05 |
| Cross-hatch adhesion test | B | A | AA | AA | AA | AA | B |
| Thermal & humidity test | 0.90 | 0.90 | 1.00 | 1.00 | 1.00 | 1.00 | 0.95 |

The efficiencies of the photoelectric conversion are obtained by standardizing the measured values with respect to the temperature gradient of zero.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

TABLE 16

| | | |
|---|---|---|
| Deposition conditions for 211 | Source gas | SiH$_4$:20 cm$^3$/min (normal)<br>H$_2$:100 cm$^3$/min (normal)<br>PH$_3$ (Diluted to 2% with H$_2$): 30 cm$^3$/min (normal) |
| | Substrate temperature | 300° C. |
| | Pressure | 133 Pa (1.0 Torr) |
| Deposition conditions for 212 | Source gas | SiH$_4$:SiF$_4$:H$_2$ = 1:4:10<br>τ = 0.4 sec. |
| | Substrate backside temperature | 350° C. |
| | Temperature gradient (continuously changed) | At the beginning of deposition: 1000° C./m (Temperature on the side of deposition Surface > temperature on the backside)<br>At the end of deposition: 1000° C./m (Temperature on the side of deposition surface < temperature on the backside) |
| | Pressure | 200 Pa (1.5 Torr) |
| Deposition conditions for 213 | Source gas | SiH$_4$:10 cm$^3$/min (normal)<br>H$_2$:800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 17

| | | |
|---|---|---|
| Deposition conditions for 211 | Source gas | SiH$_4$:20 cm$^3$/min (normal)<br>H$_2$:100 cm$^3$/min (normal)<br>PH$_3$ (Diluted to 2% with H$_2$): 30 cm$^3$/min (normal) |
| | Substrate temperature | 300° C. |
| | Pressure | 133 Pa (1.0 Torr) |
| Deposition conditions for 212 | Source gas | SiF$_4$:H$_2$ = 1:3<br>τ = 0.5 sec. |
| | Substrate backside temperature | 300° C. |
| | Temperature gradient (continuously changed) | At the beginning of deposition: 2000° C./m (Temperature on the side of deposition surface > temperature on the backside)<br>At the end of deposition: 2000° C./m (Temperature on the side of deposition surface < temperature on the backside) |
| | Pressure | 200 Pa (1.5 Torr) |
| Deposition conditions for 213 | Source gas | SiH$_4$:10 cm$^3$/min (normal)<br>H$_2$:800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 18

| | Fill factor | Change in photoelectric conversion efficiencies (Post-test efficiency/initial efficiency) |
|---|---|---|
| Example 14-1 | 1 | 1.0 |
| Example 14-2 | 1.01 | 1.0 |
| Example 14-3 | 0.99 | 1.0 |
| Example 14-4 | 0.98 | 1.0 |
| Example 14-5 | 0.98 | 1.0 |
| Comparative example 14-1 | 0.94 | 0.98 |
| Comparative example 14-2 | 0.93 | 0.98 |
| Comparative example 14-3 | 0.90 | 0.96 |
| Comparative example 14-4 | 0.88 | 0.94 |
| Comparative example 14-5 | 0.75 | 0.92 |

TABLE 19

| | | |
|---|---|---|
| Deposition conditions for 211 | Source gas | SiH$_4$:20 cm$^3$/min (normal)<br>H$_2$:100 cm$^3$/min (normal)<br>PH$_3$ (Diluted to 2% with H$_2$): 30 cm$^3$/min (normal) |
| | Substrate temperature | 300° C. |

TABLE 19-continued

| | | |
|---|---|---|
| Deposition conditions for 212 | Pressure | 133 Pa (1.0 Torr) |
| | Source gas | SiH$_4$:SiF$_4$:H$_2$ = 1:1:3<br>τ = 0.7 sec. |
| | Substrate backside temperature | 400° C. |
| | Temperature gradient (continuously changed) | At the beginning of deposition: 1000° C./m (Temperature on the side of deposition surface > temperature on the backside)<br>At the end of deposition: 1000° C./m (Temperature on the side of deposition surface < temperature on the backside) |
| | Pressure | 200 Pa (1.5 Torr) |
| Deposition conditions for 213 | Source gas | SiH$_4$:10 cm$^3$/min (normal)<br>H$_2$:800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 20

| | Initial photoelectric conversion efficiencies | Cross-hatch adhesion test | Change in photoelectric conversion efficiencies (Post-test efficiency/initial efficiency) |
|---|---|---|---|
| Example 15-1 | 1 | A | 1.0 |
| Example 15-2 | 1.03 | A | 1.0 |
| Example 15-3 | 1.06 | AA | 1.0 |
| Example 15-4 | 1.10 | AA | 1.0 |
| Example 15-5 | 1.09 | AA | 1.0 |
| Example 15-6 | 1.05 | A | 1.0 |
| Example 15-7 | 0.98 | A | 1.0 |
| Comparative example 15-1 | 0.93 | A | 1.0 |
| Comparative example 15-2 | 0.94 | A | 1.0 |
| Comparative example 15-3 | 0.94 | A | 0.98 |
| Comparative example 15-4 | 0.92 | A | 0.97 |
| Comparative example 15-5 | 0.90 | B | 0.94 |
| Comparative example 15-6 | 0.85 | B | 0.93 |
| Comparative example 15-7 | 0.80 | B | 0.92 |

The initial efficiencies of the photoelectric conversion are obtained by standardizing the measured values with respect to the value in Example 3-1.

The rating in the cross-hatch adhesion test is given as a symbol grade representing the number of squares removed: AA (0), A (1-2), B (3-10), or C (10-100).

TABLE 21

| | | |
|---|---|---|
| Deposition conditions for 211 | Source gas | SiH$_4$:20 cm$^3$/min (normal)<br>H$_2$:100 cm$^3$/min (normal)<br>PH$_3$ (Diluted to 2% with H$_2$): 30 cm$^3$/min (normal) |
| | Substrate temperature | 300° C. |
| | Pressure | 133 Pa (1.0 Torr) |
| Deposition conditions for 212 | Source gas | SiH$_4$:H$_2$ = 1:12<br>τ = 0.4 sec. |
| | Substrate backside temperature | 250° C. |
| | Temperature gradient (continuously changed) | At the beginning of deposition: 2000° C./m (Temperature on the side of deposition surface < temperature on the backside)<br>At the end of deposition: 2000° C./m (Temperature on the side of deposition surface > temperature on the backside) |
| | Pressure | 1500 Pa (11.3 Torr) |
| Deposition conditions for 213 | Source gas | SiH$_4$:10 cm$^3$/min (normal)<br>H$_2$:800 cm$^3$/min (normal)<br>BF$_3$ (Diluted to 2% with H$_2$): 100 cm$^3$/min (normal) |
| | Substrate temperature | 200° C. |
| | Pressure | 160 Pa (1.2 Torr) |

TABLE 22

| | Example 15-3 | Example 18-1 | Example 18-2 | Example 18-3 | Example 18-4 |
|---|---|---|---|---|---|
| Oxygen concentration in thin film (atoms/cm$^3$) | 1.0 × 10$^{18}$ | 1.5 × 10$^{18}$ | 7.0 × 10$^{18}$ | 5.0 × 10$^{19}$ | 7.0 × 10$^{19}$ |
| Initial photoelectric conversion efficiencies | 1 | 1.10 | 1.12 | 1.14 | 1.03 |
| Change in photoelectric conversion efficiencies (Post-test efficiency/initial efficiency) | 1.0 | 1.0 | 1.0 | 1.0 | 0.97 |

TABLE 23

| Distance between electrically conductive substrate and high frequency input unit (nm) | 2 | 3 | 6 | 9 | 15 | 30 | 50 |
|---|---|---|---|---|---|---|---|
| Photoelectric conversion efficiencies | — | 1 | 1.02 | 1.02 | 1.10 | 1.10 | 0.75 |

The results are obtained by standardizing the measured values with respect to the distance (3 mm) between the electrically conductive substrate and the high frequency input unit.

TABLE 24

| Pressure in semiconductor fabrication chamber 213 (Pa) | 50 | 90 | 100 | 1000 | 5000 | 10000 | 15000 | 20000 |
|---|---|---|---|---|---|---|---|---|
| Photoelectric conversion efficiencies | 1 | 1.18 | 1.30 | 1.35 | 1.35 | 1.30 | 1.20 | 0.95 |
| Cross-hatch adhesion test | C | A | AA | AA | AA | A | A | B |
| Thermal & humidity test | 0.70 | 0.90 | 1.0 | 1.0 | 1.0 | 0.95 | 0.9 | 0.70 |

The efficiencies of the photoelectric conversion are obtained by standardizing the measured values with respect to the pressure (50 Pa) within the semiconductor fabrication chamber 213.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

TABLE 25

| Residence time (sec.) in semiconductor fabrication chambers 212 & 213 | 0.008 | 0.01 | 0.1 | 1.0 | 3.0 | 10 | 15 |
|---|---|---|---|---|---|---|---|
| Photoelectric conversion efficiencies | 1 | 1.35 | 1.40 | 1.40 | 1.35 | 1.30 | 0.85 |
| Cross-hatch adhesion test | B | A | AA | AA | AA | A | C |
| Thermal & humidity test | 0.7 | 0.9 | 1.0 | 1.0 | 1.0 | 1.0 | 0.7 |

The efficiencies of the photoelectric conversion are obtained by standardizing the measured values with respect to the residence time (0.008 sec.) in the semiconductor fabrication chambers 212 and 213.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

TABLE 26

| Deposition conditions for 216 | Source gas | $SiH_4$:20 cm³/min (normal) $H_2$:100 cm³/min (normal) $PH_3$ (Diluted to 2% with $H_2$): 50 cm³/min (normal) |
|---|---|---|
| | Substrate temperature | 300° C. |
| | Pressure | 133 Pa (1.0 Torr) |
| Deposition conditions for 217 | Source gas | $SiH_4$:300 cm³/min (normal) $H_2$:4000 cm³/min (normal) |
| | Substrate temperature | 300° C. |
| | Pressure | 1500 Pa (11.3 Torr) |
| Deposition conditions for 218 | Source gas | $SiH_4$:10 cm³/min (normal) $H_2$:800 cm³/min (normal) $BF_3$ (Diluted to 2% with $H_2$): 100 cm³/min (normal) |
| | Substrate temperature | 200° C. |
| | Pressure | 160 Pa (1.2 Torr) |

TABLE 27

| Temperature gradient at the end of deposition (° C./m) | 0 | 100 | 500 | 1000 | 10000 | 100000 | 500000 |
|---|---|---|---|---|---|---|---|
| Photoelectric conversion efficiencies | 1 | 1.00 | 1.10 | 1.12 | 1.13 | 1.13 | 1.05 |
| Cross-hatch adhesion Test | B | A | AA | AA | AA | AA | B |
| Thermal & humidity test | 0.90 | 0.90 | 1.00 | 1.00 | 1.00 | 1.00 | 0.95 |

The efficiencies of the photoelectric conversion are obtained by standardizing the measured values with respect to the temperature gradient of zero.

The rating in the cross-hatch adhesion test is given as a symbol grade representing the number of squares removed: AA (0), A (1-2), B (3-10), or C (10-100).

The results of the thermal and humidity test are obtained by the equation: (post-test photoelectric conversion efficiency)/(pre-test photoelectric conversion efficiency).

What is claimed is:

1. A process for forming a silicon-based film on a substrate, comprising providing a temperature gradient in the thickness direction of the substrate in the formation of the silicon-based film, wherein the temperature gradient is made such that a deposition surface of the substrate has a higher temperature than a backside, and wherein the silicon-based film is formed on the substrate loaded in a vacuum vessel, using a plasma CVD technique that involves introducing a source gas containing hydrogen and at least one of a hydrogenated silicon gas and a fluorinated silicon gas into the vacuum vessel and introducing high frequency waves into a high frequency input unit in the vacuum vessel.

2. The process for forming a silicon-based film as claimed in claim 1, wherein the temperature gradient C is defined by C=ΔT/d, d representing a thickness of the substrate and ΔT representing a temperature difference between the deposition surface and the backside of the substrate, and wherein a value of C is in a range between 500° C./m and 100,000° C./m, both inclusive.

3. The process for forming a silicon-based film as claimed in claim 1, wherein heat sources are provided on the deposition surface side of the substrate and the backside thereof, the heat sources being used to apply heat to the substrate in the formation of the silicon-based film.

4. The process for forming a silicon-based film as claimed in claim 1, wherein a cooling mechanism is provided on the deposition surface side of the substrate and/or the backside thereof in the formation of the silicon-based film.

5. The process for forming a silicon-based film as claimed in claim 1, wherein the temperature of the backside of the substrate is reduced in the course of forming the silicon-based film.

6. The process for forming a silicon-based film as claimed in claim 1, wherein the silicon-based film is a silicon-based film including a crystalline phase.

7. The process for forming a silicon-based film as claimed in claim 6, wherein the silicon-based film including the crystalline phase has a region of which ratio of the diffraction intensity of (220) planes in the crystalline phase is 80% or higher with respect to the total diffraction intensity obtained using an x-ray or an electron beam.

8. The process for forming a silicon-based film as claimed in claim 1, wherein the high frequency waves have a frequency between 10 MHz and 10 GHz, both inclusive.

9. The process for forming a silicon-based film as claimed in claim 8, wherein the high frequency waves have a frequency between 20 MHz and 300 MHz, both inclusive.

10. The process for forming a silicon-based film as claimed in claim 1, wherein a distance between the high frequency input unit and the substrate is equal to or larger than 3 mm but not larger than 30 mm.

11. The process for forming a silicon-based film as claimed in claim 1, wherein a pressure in forming the silicon-based film is equal to or higher than 100 Pa (0.75 Torr) but not higher than 5,000 Pa (37.5 Torr).

12. The process for forming a silicon-based film as claimed in claim 1, wherein a residence time of the source gas in forming the silicon-based film is equal to or longer than 0.01 seconds but not longer than 10 seconds.

13. The process for forming a silicon-based film as claimed in claim 12, wherein the residence time of the source gas in forming the silicon-based film is equal to or longer than 0.1 seconds but not longer than 3 seconds.

14. The process for forming a silicon-based film as claimed in claim 1, wherein a power density in forming the silicon-based film is equal to or higher than 0.01 W/cm$^3$ but not higher than 2 W/cm$^3$.

15. The process for forming a silicon-based film as claimed in claim 14, wherein the power density in forming the silicon-based film is equal to or higher than 0.1 W/cm$^3$ but not higher than 1 W/cm$^3$.

16. The process for forming a silicon-based film as claimed in claim 1, wherein the silicon-based film contains at least one of oxygen atoms, carbon atoms and nitrogen atoms, and wherein the total amount thereof is equal to or larger than $1.5 \times 10^{18}$ atoms/cm$^3$ but not larger than $5.0 \times 10^{19}$ atoms/cm$^3$.

17. The process for forming a silicon-based film as claimed in claim 1, wherein the silicon-based film contains fluorine atoms in an amount equal to or larger than $1.0 \times 10^{19}$ atoms/cm$^3$ but not larger than $2.5 \times 10^{20}$ atoms/cm$^3$.

18. A process for forming a silicon-based film on a substrate, comprising providing a temperature gradient in the thickness direction of the substrate in the formation of the silicon-based film wherein the direction of the temperature gradient is reversed during the formation of the silicon-based film.

19. The process for forming a silicon-based film as claimed in claim 18, wherein the temperature gradient C is defined by C=ΔT/d, d representing a thickness of the substrate and ΔT representing a temperature difference between the deposition surface and the backside of the substrate, and wherein a value of C is varied within a range not larger than 100,000° C./m.

20. The process for forming a silicon-based film as claimed in claim 18, wherein in the process where the direction of the temperature gradient is reversed during the formation of the silicon-based film, the temperature gradient C includes a range of at least 500° C./m in a process where the deposition surface of the substrate has a higher temperature than the backside and in a process where the backside has a higher temperature than the deposition surface.

21. The process for forming a silicon-based film as claimed in claim 18, wherein heat sources are provided on the deposition surface side of the substrate and the backside thereof, the heat sources being used to apply heat to the substrate in the formation of the silicon-based film.

22. The process for forming a silicon-based film as claimed in claim 18, wherein a cooling mechanism is provided on the deposition surface side of the substrate and/or the backside thereof in the formation of the silicon-based film.

23. The process for forming a silicon-based film as claimed in claim 18, wherein the temperature of the backside of the substrate is reduced in the course of forming the silicon-based film.

24. The process for forming a silicon-based film as claimed in claim 18, wherein the silicon-based film is a silicon-based film including a crystalline phase.

25. The process for forming a silicon-based film as claimed in claim 24, wherein the silicon-based film including the crystalline phase has a region of which ratio of the diffraction intensity of (220) planes in the crystalline phase is 80% or higher with respect to the total diffraction intensity obtained using an x-ray or an electron beam.

26. The process for forming a silicon-based film as claimed in claim 18, wherein the silicon-based film is formed on the substrate loaded in a vacuum vessel, using a plasma CVD technique that involves introducing a source gas containing hydrogen and at least one of a hydrogenated silicon gas and a fluorinated silicon gas into the vacuum vessel and introducing high frequency waves into a high frequency input unit in the vacuum vessel.

27. The process for forming a silicon-based film as claimed in claim 26, wherein the high frequency waves have a frequency between 10 MHz and 10 GHz, both inclusive.

28. The process for forming a silicon-based film as claimed in claim 27, wherein the high frequency waves have a frequency between 20 MHz and 300 MHz, both inclusive.

29. The process for forming a silicon-based film as claimed in claim 26, wherein a distance between the high frequency input unit and the substrate is equal to or larger than 3 mm but not larger than 30 mm.

30. The process for forming a silicon-based film as claimed in claim 26, wherein a pressure in forming the silicon-based film is equal to or higher than 100 Pa (0.75 Torr) but not higher than 5,000 Pa (37.5 Torr).

31. The process for forming a silicon-based film as claimed in claim 26, wherein a residence time of the source gas in forming the silicon-based film is equal to or longer than 0.01 seconds but not longer than 10 seconds.

32. The process for forming a silicon-based film as claimed in claim 31, wherein the residence time of the source gas in forming the silicon-based film is equal to or longer than 0.1 seconds but not longer than 3 seconds.

33. The process for forming a silicon-based film as claimed in claim 26, wherein a power density in forming the silicon-based film is equal to or higher than $0.01$ W/cm$^3$ but not higher than 2 W/cm$^3$.

34. The process for forming a silicon-based film as claimed in claim 33, wherein the power density in forming the silicon-based film is equal to or higher than 0.1 W/cm$^3$ but not higher than 1 W/cm$^3$.

35. The process for forming a silicon-based film as claimed in claim 26, wherein the silicon-based film contains at least one of oxygen atoms, carbon atoms and nitrogen atoms, and wherein the total amount thereof is equal to or larger than $1.5 \times 10^{18}$ atoms/cm$^3$ but not larger than $5.0 \times 10^{19}$ atoms/cm$^3$.

36. The process for forming a silicon-based film as claimed in claim 26, wherein the silicon-based film contains fluorine atoms in an amount equal to or larger than $1.0 \times 10^{19}$ atoms/cm$^3$ but not larger than $2.5 \times 10^{20}$ atoms/cm$^3$.

37. A process for forming a silicon-based film on a substrate, comprising providing a temperature gradient in the thickness direction of the substrate in the formation of the silicon-based film, wherein the temperature gradient is made such that a deposition surface of the substrate has a higher temperature than a backside, and wherein the temperature of the backside of the substrate is reduced in the course of forming the silicon-based film.

* * * * *

UNITED STATES PATENT AND TRADEMARK OFFICE
CERTIFICATE OF CORRECTION

PATENT NO. : 6,794,275 B2
DATED : September 21, 2004
INVENTOR(S) : Takaharu Kondo et al.

It is certified that error appears in the above-identified patent and that said Letters Patent is hereby corrected as shown below:

Column 1,
Line 45, "a i-type" should read -- an i-type --.

Column 4,
Line 4, "preferably" should read -- preferable --.

Column 7,
Line 5, "substrate The" should read -- substrate. The --.

Column 8,
Line 56, "the ion collision" should read -- ion collision --.

Column 9,
Line 33, "are characterized" should read -- is characterized --.

Column 10,
Line 26, "inventor" should read -- inventors --.

Column 11,
Line 46, "appears" should read -- appear --.
Line 67, "incident" should read -- incidence --.

Column 12,
Line 63, "an nitrate ion or an zinc" should read -- a nitrate ion or a zinc --.

Column 13,
Line 41, "p-and" should read -- p- and --.

Column 17,
Line 65, "hater" should read -- heater --.

Column 18,
Line 11, "wounded" should read -- wound --.

Column 24,
Line 35, "100 mW/cm2" should read -- 100 m W/cm$^2$ --.

UNITED STATES PATENT AND TRADEMARK OFFICE
CERTIFICATE OF CORRECTION

PATENT NO. : 6,794,275 B2
DATED : September 21, 2004
INVENTOR(S) : Takaharu Kondo et al.

It is certified that error appears in the above-identified patent and that said Letters Patent is hereby corrected as shown below:

Column 25,
Line 10, "a oxygen" should read -- an oxygen --.

Column 29,
Line 20, "FIG. 2*b*," should read -- FIG. 2B, --.
Line 21, "FIG. 2*a*" should read -- FIG. 2A --.

Column 31,
Line 20, "less" should read -- fewer --.

Column 32,
Line 3, "a oxygen" should read -- an oxygen --.

Column 34,
Line 15, "TFT" should read -- TFT (Example 24). --.
Line 17, " Example 24 " should be deleted.
Line 55 (Table 1), "SiH$_4$:SiF$_4$:H2" should read -- SiH$_4$:SiF$_4$:H$_2$ --.

Column 36,
Line 33 (Table 7), "efficiency" should read -- efficiency) --.

Signed and Sealed this

Twenty-fourth Day of May, 2005

JON W. DUDAS
*Director of the United States Patent and Trademark Office*